United States Patent [19]
Sunami et al.

[11] Patent Number: 4,984,030
[45] Date of Patent: Jan. 8, 1991

[54] VERTICAL MOSFET DRAM

[75] Inventors: Hideo Sunami, Nishitama; Tokuo Kure, Kokubunji; Yoshifumi Kawamoto, Tsukui; Masao Tamura; Masanobu Miyao, both of Tokorozawa, all of Japan

[73] Assignee: Hitachi, Ltd., Tokyo, Japan

[21] Appl. No.: 201,100

[22] Filed: May 31, 1988

Related U.S. Application Data

[60] Division of Ser. No. 904,397, Sep. 8, 1986, Pat. No. 4,751,557, which is a continuation of Ser. No. 474,002, Mar. 10, 1983, abandoned.

[30] Foreign Application Priority Data

Mar. 10, 1982 [JP] Japan ................................ 57-36418

[51] Int. Cl.⁵ .......................................... H01L 27/108
[52] U.S. Cl. ................................... 357/23.6; 357/23.4; 357/55
[58] Field of Search ....................... 357/23.6, 55, 23.4

[56] References Cited

U.S. PATENT DOCUMENTS

| | | | |
|---|---|---|---|
| 4,003,036 | 1/1977 | Jeanne | 357/23.6 G |
| 4,225,879 | 9/1980 | Vinson | 357/23.6 G |
| 4,271,418 | 6/1981 | Hiltpold | 357/23.6 G |
| 4,434,433 | 2/1984 | Nishizawa | 357/23.6 G |

Primary Examiner—William D. Larkins
Attorney, Agent, or Firm—Antonelli, Terry, Stout & Kraus

[57] ABSTRACT

A semiconductor memory wherein a part of each capacitor is formed on side walls of an island region surrounded with a recess formed in a semiconductor substrate, and the island region and other regions are electrically isolated by the recess.

18 Claims, 24 Drawing Sheets

VERTICAL MOSFET DRAM

This is a divisional of application Ser. No. 904,397, filed Sept. 8, 1986 now U.S. Pat. No. 4,751,557 which is a continuation of application Ser. No. 474,002, filed Mar. 10, 1983, now abandoned.

BACKGROUND OF THE INVENTION

1. Field of the Invention

The present invention relates to semiconductor memories, and more particularly to a semiconductor memory which permits a remarkable increase in the capacitance of a storage capacitor portion without the necessity of increasing a plane area.

2. Description of the Prior Art

Regarding MOS dynamic memories, enhancements in the density of integration have been achieved at a proportion of about four times every three years since dynamic random access memories (hereinbelow, abbreviated to "dRAM") of 1 kb began to be sold early in the 1970's. However, 16-pin DIPs (dual in-line packages) have been chiefly used as packages for receiving memory chips, and besides, the sizes of cavities for receiving the chips have been limited. Therefore, the size of the memory chip has increased to only, at most, 1.4 times in spite of the quadrupled magnitude integration. Accordingly, the area of a memory cell corresponding to one bit which is the unit memory capacity has decreased remarkably with the enhancement of the density of integration and has become as small as about ⅓ with the quadrupled magnitude of integration. The capacitance C of a capacitor is denoted by $C = \epsilon A/t$ (where $\epsilon$: the dielectric constant of an insulating film, A: the area of the capacitor, and t: the thickness of the insulating film), so that when the area A becomes ⅓, also the capacitance C becomes ⅓ as long as the quantities $\epsilon$ and t are held constant. The magnitude of a signal, S as the storage capacitor is proportional to the quantity of charges, Q, which in turn is the product between the capacitance C and a voltage V. Therefore, when A becomes small, Q decreases proportionally, and S decreases accordingly.

Letting N denote noise, the S/N (signal-to-noise) ratio becomes small with decrease in S, and this poses a serious problem in circuit operations. It has accordingly been common practice to compensate the decrement of A by the decrement of t. As the scale has enlarged (the density of integration has risen) to 4 kb, 16 kb and 64 kb, the thickness of a typical $SiO_2$ film has gradually decreased to 100 nm, 75 nm and 50 nm by way of example.

Further, it has recently been confirmed that charges of about 200 fC are generated within a Si substrate by $\alpha$-particles which are emitted from radioactive heavy metals (U, Th etc.) contained in the package etc., and that they form noise. From the standpoint of a high reliability operation, it has become difficult to render the signal magnitude Q below approximately 200 fC.

Accordingly, it has become practice to make the insulating film still thinner. It has then turned out that the dielectric breakdown of the insulating film is problematic. The dielectric breakdown field of $SiO_2$ is $10^7$ V/cm at the maximum. Accordingly, an $SiO_2$ film 10 nm thick is nearly permanently broken down or is deteriorated by applying 10 V thereto. When the reliability over a long term is taken into account, the smallest possible voltage below the maximum breakdown voltage needs to be used. It is therefore difficult to make the insulating film of the capacitor very thin.

That is, in order to enhance the density of integration of a semiconductor memory without incurring such problems as the lowering of the S/N ratio, the disturbance ascribable to the $\alpha$-particles and the dielectric breakdown, the required area of a memory cell must be reduced by keeping or increasing the electrode area of a capacitor without thinning the insulating film of the capacitor.

In this regard, however, the storage capacitor portion of the conventional dynamic memory has been formed of a semiconductor substrate, and an insulating film and a plate (conductor film) which are stacked and deposited on the surface of the semiconductor substrate. In order to simultaneously reduce the required area of the memory cell, accordingly, there is no other way than decreasing the electrode area of the capacitor. This has formed a serious hindrance to the enhancement of the density of integration of the semiconductor memory.

To the end of solving such problems, it has been proposed to form a recess in a semiconductor substrate and to utilize the recess for a capacitor (Japanese Patent Application Publication No. 56-48976, Japanese Patent Application Laying-open No. 51-130178, which corresponds to U.S. Pat. No. 3,962,713). The proposal, however, does not refer to the decrease of the area of an isolation region among semiconductor elements. The required area of a semiconductor memory must be further reduced in order to fabricate an integrated circuit having an extraordinarily high density of integration.

SUMMARY OF THE INVENTION

An object of the present invention is to solve the problems of the prior art arrangements, and to provide a semiconductor memory well-suited to an integrated circuit which requires a very small area and which has an extraordinarily high density of integration.

Another object of the present invention is to provide a semiconductor memory having capacitors and isolation regions the required areas of which are very small.

In order to accomplish the objects, according to the present invention, the side walls of an island region enclosed with a recess are utilized as a part of a capacitor, and the recess is used for the electrical isolation between the island region and another region as well.

DETAILED DESCRIPTION OF THE PREFERRED EMBODIMENTS

Figure 1:
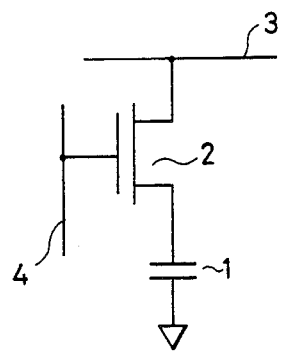
FIGS. 1, 2 and 3 are connection diagrams for explaining the operations of a semiconductor memory.

FIG. 1 is a diagram showing the arrangement of a 1-transistor type dynamic memory cell. The memory cell is constructed of a capacitor 1 for storing charges, and a switching MOS transistor 2. The drain of the switching transistor 2 is connected to a bit line 3, and the gate thereof is connected to a word line 4.

Figure 2:
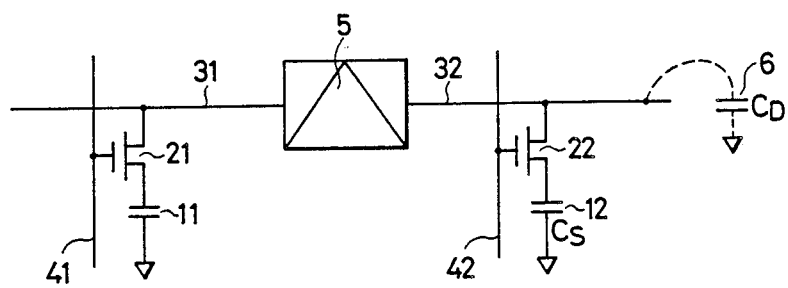

In operation, the signal charges stored in the capacitor 1 are read out by means of the switching transistor 2. In constructing an actual memory of n bits, a memory array is configured. Methods therefor are broadly classified into the following two. FIG. 2 illustrates the first method, and shows the so-called "open bit line" configuration in which bit lines 31 and 32 are arrayed on both the sides of a sense amplifier 5 for differentially deriving a signal. Only one bit line 31 electrically intersects a single word line 41, and the difference between the signals of the bit lines 31 and 32 is detected by the sense amplifier 5.

Figure 3:
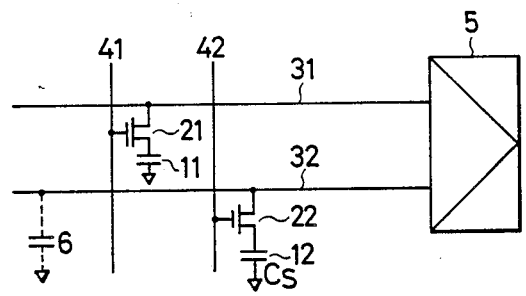

FIG. 3 illustrates the second method, and shows the so-called "folded bit line" configuration. Two bit lines 31 and 32 connected to a sense amplifier 5 are arrayed in parallel, and a single word line 41 intersects the two bit lines 31 and 32.

While the embodiments of the present invention to be described later will refer principally to the case of the folded bit line configuration, the present invention is not restricted thereto but is similarly applicable to the open bit line configuration.

Letting $C_D$ denote the value of the parasitic capacitance 6 of the bit line 32 and $C_S$ the capacitance of the capacitor 12 of the memory cell as shown in FIG. 2 or FIG. 3, one of the major figures of merit of the memory array becomes $C_S/C_D$. The S/N (signal-to-noise) ratio of the memory array is in 1-to-1 correspondence with $C_S/C_D$, and is enhanced by increasing the capacitance $C_S$ of the capacitor of the memory cell and decreasing the parasitic capacitance $C_D$ of the bit line 3.

Figure 4:
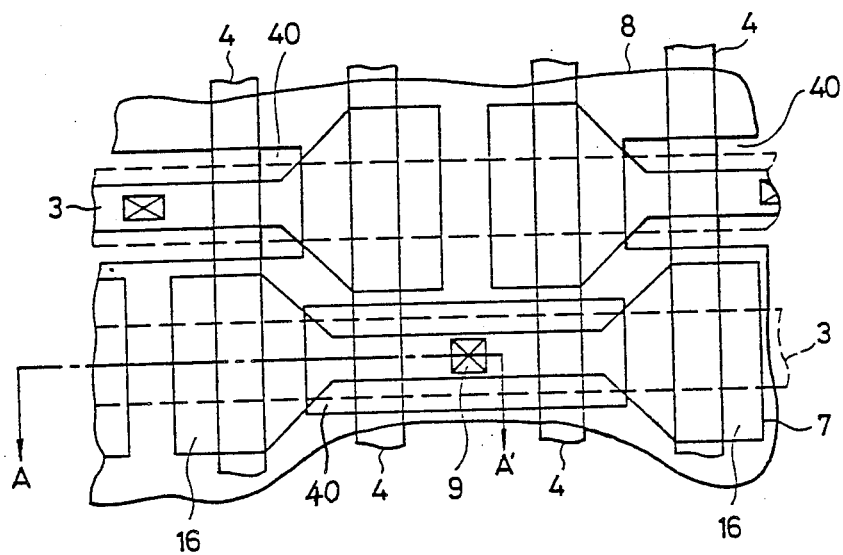
FIGS. 4 and 5 are views showing the essential portions of the plan and sectional structures of the prior-art semiconductor memory, respectively.
Figure 5:
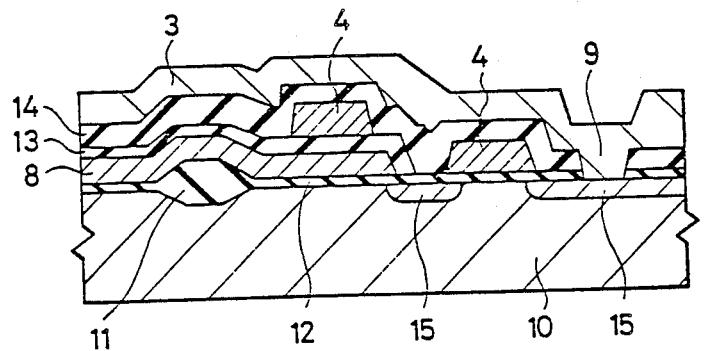

FIG. 4 shows an example of the plan structure of the prior-art memory cell of the folded bit line system. A part of an active region 7 surrounded with a thick field oxide film 11, which is usually at least 100 nm thick, is covered with a plate 8 in order to form capacitors in the area 16. The plate 8 is selectively removed in a part 40 in which the switching transistor, and a contact hole 9 for connecting the drain to the bit line on a Si substrate are to be formed. In this part, the word lines 4 are deposited, and the switching transistor 2 is formed. In order to facilitate understanding, FIG. 5 shows a sectional view taken along A—A' in FIG. 4.

The prior-art dynamic memory is fabricated as stated below. For the sake of convenience, the transistors are exemplified as the n-channel type. In order to form p-channel type transistors, the conductivity types of the Si substrate and diffused layers may, in general, be reversed to those in the case of the n-channel type.

On the selected areas of the p-type Si substrate 10 having a resistivity of approximately 10 Ω·cm, a field SiO$_2$ film 11 usually having a thickness of approximately 100–1000 nm is formed by, e. g., the well-known and so-called LOCOS process which employs Si$_3$N$_4$ for an oxidation-resistant mask. Thereafter, a gate oxide film 12 which is 10–100 nm thick is formed on the Si substrate 10 by the thermal oxidation or the like. Subsequently, the plate 8 which is made of, e. g., polycrystalline Si doped with phosphorus or As is deposited on selected areas, and the surface of the plate 8 made of the polycrystalline Si is oxidized to form a first inter-layer oxide film 13. Thereafter, the word lines 4 which are made of, e. g., polycrystalline Si, refractory metal silicide or a pure refractory metal (such as Mo and W) are deposited. When phosphorus, As or the like is subsequently ion-implanted, n$^+$-type diffused layers 15 are formed in those parts of the active region on which neither the plate 8 nor the word line 4 is deposited, and they serve as the source and drain of each switching transistor 2. Using the well-known CVD process, a PSG (phosphosilicate glass) film 14 is deposited to a thickness of 500–1000 nm. The bit lines 3 typified by Al electrode buses are deposited on selected areas after the contact holes 9 have been formed in parts where the bit lines 3 are to be connected with the diffused layers 15.

In the prior-art memory cell thus formed, the area 16 of the capacitor 1 to form a storage capacitance becomes small when the size of the memory cell decreases, as seen from FIG. 4. Accordingly, unless the gate oxide film 12 is thinned, the capacitor capacitance $C_S$ becomes small as explained before, which poses a serious problem in the memory operation.

The present invention eliminates the aforementioned disadvantage of the prior-art semiconductor memory, and provides a semiconductor memory which can increase the capacitor capacitance $C_S$ without enlarging the plane area of a memory cell.

Figure 6:
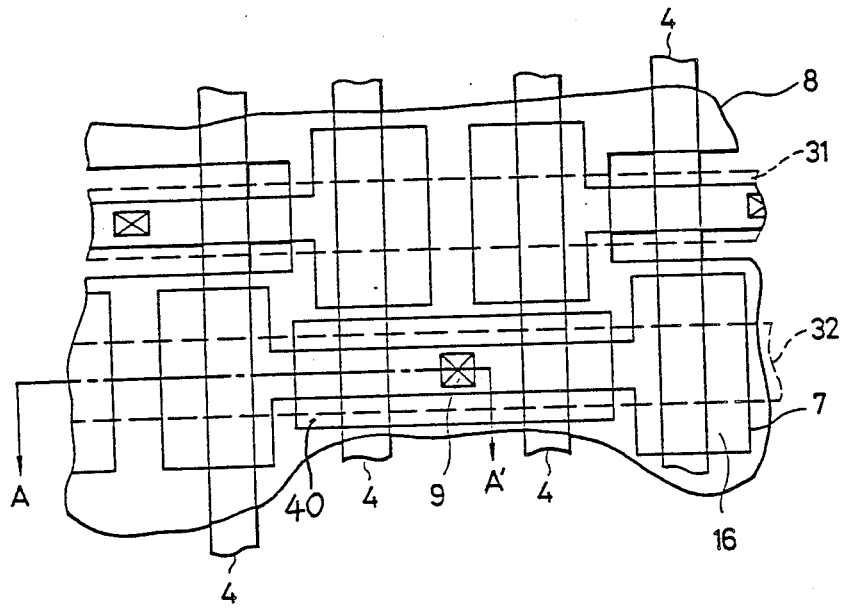
FIGS. 6 and 7 are views showing the plan and sectional structures of the essential portions of an embodiment of the present invention, respectively.
Figure 7:
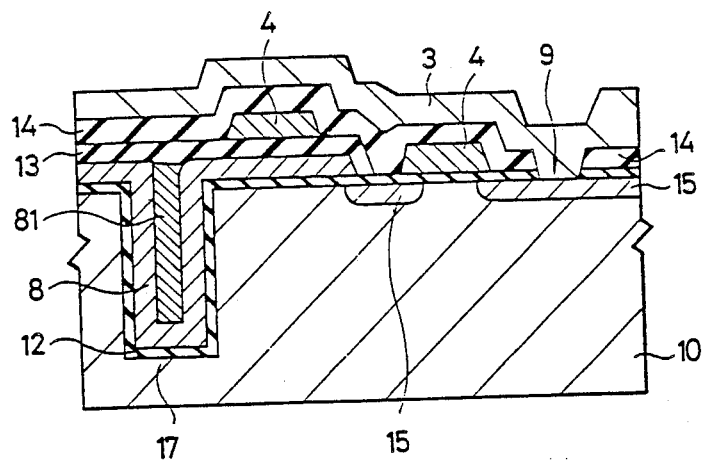

Now, the present invention will be described in detail in conjunction with embodiments. FIG. 6 shows the essential portions of the plan structure of one embodiment of the present invention. As compared with the prior-art memory cell shown in FIG. 4, the embodiment differs as stated hereunder. The active region 7 is surrounded with a recess 17. More specifically, in the prior-art semiconductor memory, the isolation of the active regions 7 among the memory cells is effected by the field oxide film 11 as shown in FIG. 5, whereas in the present invention, it is effected by the recess 17 formed in the semiconductor substrate, as shown in FIG. 7 (FIG. 7 is a sectional view taken along A—A' in FIG. 6). That is, in the present invention, each active region 7 is entirely enclosed with the recess 17, the plate 8 buried in the recess 17, and the insulating film 12, whereby the respective active regions are isolated from one another.

Therefore, the field oxide film having hitherto been used for the isolation among the respective active regions is not required for this purpose, and the required area for the memory can be remarkably reduced.

Moreover, as seen from FIG. 7, the capacitor is formed in such a manner that the insulating film 12 and the plate 8 are stacked and deposited on the side surface of the recess 17, so a capacitance of sufficient magnitude can be attained in the areas 16 without increasing the required area.

In the next place, the manufacturing process of the semiconductor memory incorporating the basic structure shown in FIG. 7 will be described.

Figure 8:
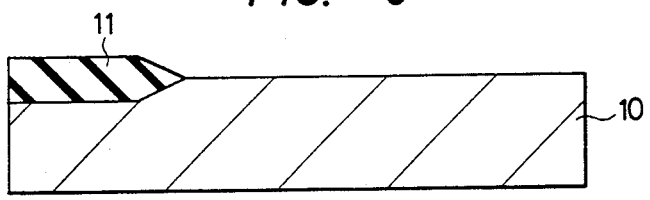
FIGS. 8 to 15 are flow diagrams showing the manufacturing method of an embodiment of the present invention.
Figure 9:

First, as shown in FIG. 8, the field $SiO_2$ film 11 having a thickness of 500–1000 nm is formed on the surface of the p-type semiconductor substrate 10 by the use of the well-known LOCOS process. The field $SiO_2$ film 11 may well be formed as shown in FIG. 9 by covering the whole surface of the substrate with an $SiO_2$ film and then removing an unnecessary part, without resorting to the LOCOS process. In an example of the present embodiment, the LOCOS process was used. The field $SiO_2$ film 11 formed by the LOCOS process is not used for the isolation among the memory cells, but it is used as desired, for a direct peripheral circuit such as sense amplifier which is connected to the memory cell or for an indirect peripheral circuit which generates a group of timing pulses for governing various memory operations. Since the recess 17 is covered with the plate 8 through the very thin gate oxide film or capacitor insulating film, this portion exhibits a large parasitic capacitance and is unsuited to the fast operation of the circuitry. In the aforementioned part, especially the indirect peripheral circuit, the use of the field insulating film 11 in the prior art formed by the LOCOS process is more advantageous than the use of the recess.

Figure 10:
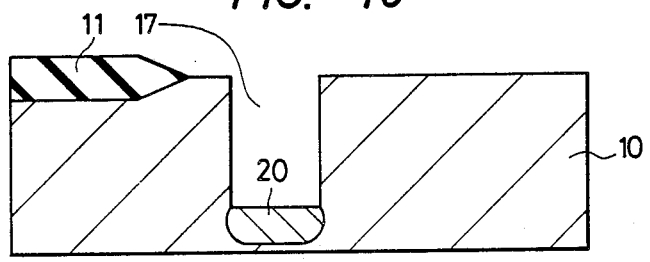
Figure 11:
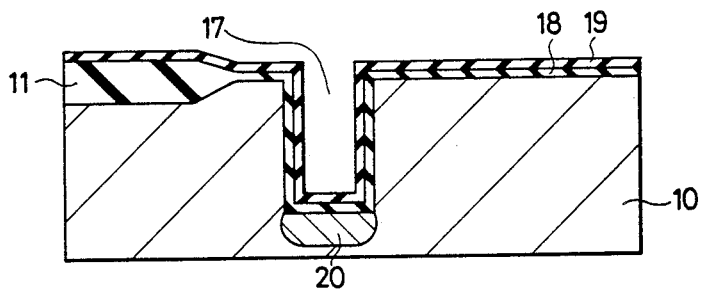

As shown in FIG. 10, the etched recess 17 is formed in each predetermined part of the Si substrate 10 by a parallel-plate type plasma etching equipment by the use of a gas of F or Cl, for example, a gas whose principal ingredient is $CF_4$, $SF_6$, $CCl_4$ or the like or contains H in addition to it. Regarding a mask to be used for the plasma etching, when an ordinary mask made of a photoresist film is used, it is feared that the mask itself will also be etched to disappear Therefore, a mask made of a film consisting of the three layers of $SiO_2$, $Si_3N_4$ and $CVD.SiO_2$ may be formed on the Si substrate 10 after the formation of the field oxide film and may be used for etching the Si substrate 10. Needless to say, any mask other than the three-layered film may be used as the mask every this case.

The depth of the etching recess is hardly limited. However, when the depth $D_M$ is set at about 0.5 $W_M$–5 $W_M$ where $W_M$ denotes the width of the groove, very favorable results are obtained in practical use. In addition, when the angle of the upper end part of the recess is sharp, the dielectric breakdown voltage is sometimes lowered by the electric field crowding. It is therefore recommended to round the corner of the upper end part by such isotropic etching as wet etching before the recess is formed deep. The recess 17 serves for both the capacitor and the isolation. Accordingly, in the case of using the Si substrate 10 of 10 $\Omega \cdot$cm by way of example, boron was ion-implanted into the bottom of the recess 17 in a range of $1 \times 10^{11}$—$1 \times 10^{13}$ cm$^{-2}$, and annealing at 900°–1000° C. was thereafter conducted, whereby a heavily-doped isolation layer 20 was formed as shown in FIG. 10.

Subsequently, an $SiO_2$ film 18 and an $Si_3N_4$ film 19 were stacked and formed as the insulating film of the capacitor. The insulating film of the capacitor may be high in the breakdown voltage and stable electrically. The materials of the insulating film having heretofore been used are thermal oxidation $SiO_2$; thermal nitrification $Si_3N_4$; CVD $Si_3N_4$; $Ta_2O_5$, $Nb_2O_5$, $GrO_2$ or $TiO_2$ produced by the CVD or the reactive sputtering; etc. The single or multiple layer of the film or films of such material or materials can be used as the capacitor insulating film. In the present example, the stacked films of $SiO_2$ and $Si_3N_4$ were used.

When the recess 17 is formed in the Si substrate 10 by the dry etching (such as plasma etching and sputter etching), electrical and crystallographic damages and contaminations develop in the Si substrate 10 more or less unlike the case of applying the wet etching. After the dry etching, accordingly, the Si substrate 10 may be wet-etched by about 10–500 nm to the extent that the damages and contaminations pose, in effect, no problem. When the aqueous solution of an $NH_4OH + H_2O_2$ system or an $HF + HNO_3$ system is used as an etchant, a favorable result can be obtained.

After the damages and contaminations of the Si substrate 10 and the surface of the recess 17 have been removed by the wet etching, the $SiO_2$ film 18 having a thickness of 5–20 nm is formed by the well-known thermal oxidation in an oxidizing atmosphere at a temperature of 900°–1200° C. Next, the $Si_3N_4$ film 19 having a thickness of 5–20 nm is stacked and deposited by the CVD process at 650°–850° C. Thus, the insulating film of the capacitor is finished. Needless to say, since the thicknesses of the films are set in consideration of the desired capacitance and breakdown voltage per unit area, values outside the aforementioned range thereof are sometimes used. The internal stress of the CVD $Si_3N_4$ film 19 mounts up to about $1 \times 10^{10}$ dyn/cm$^2$, so that when the $Si_3N_4$ film 19 is deposited directly on the Si substrate 10, defects arise in the Si substrate 10 to degrade the characteristics of the memory. Accordingly, the $Si_3N_4$ film 19 is underlaid with the $SiO_2$ film 18 so as to prevent the occurrence of the defects. When the Si substrate 10 is directly nitrified to form an $Si_3N_4$ film, a dense film having a high breakdown voltage can be obtained. However, a reaction time in excess of 1 hour is required for obtaining a film thicker than 10 nm. Moreover, when the film thickness exceeds 10 nm, the increasing rate thereof lowers abruptly. This method is therefore unsuitable for producing a thick film. When the $Si_3N_4$ film 19 has its surface thermally oxidized by 2–5 nm, its pinhole parts are oxidized to be thick. This favorably results in that the dielectric breakdown voltage can be enhanced, and that the thickened parts serve as stoppers against overetching in the case of dry-etching polycrystalline Si to be formed on the film 19.

Figure 12:
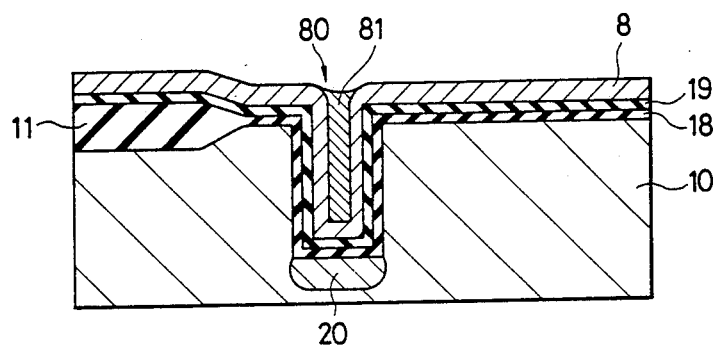

Next, the plate 8 made of, e. g., polycrystalline Si is deposited on the whole surface as shown in FIG. 12.

When the CVD process is used in this case the polycrystalline Si readily deforms to conform to the recess 17, in the manner shown in FIG. 12 so that the polycrystalline Si deposited on the side wall part of the recess 17 becomes approximately equal in thickness to that deposited on the upper surface of the Si substrate. Phosphorus is thermally diffused into the polycrystalline Si film 8 by the use of POCl$_3$ gas or the like.

The width of the etched recess 17 is $W_M$. Therefore, when $W_M > 2 T_{S1}$ holds where $T_{S1}$ denotes the thickness of the polycrystalline Si film 8, a recess 80 as shown in FIG. 12 is left unfilled, so that the top surface of the device does not become flat. Since the recess 80 adversely affects the processing and the deposited states of the insulating film and the word line 4 to be deposited thereon, it should better be filled to flatten the surface. In the present embodiment, polycrystalline Si is deposited on the whole surface to a thickness $T_{S2}$, whereupon the whole area of the deposited polycrystalline Si is removed by the thickness $T_{S2}$ from above by the well-known plasma etching which employs CF$_4$ or SF$_6$ gas. Then, as shown in FIG. 12, the polycrystalline Si 81 remains in the form in which it is Just buried in the recess 80, and the upper surface becomes flat. In a case where the polycrystalline Si film 8 is thickened thereby to fill up the recess, the second deposition of the polycrystalline Si is not necessary. Since, however, the plate 8 is also used as an interconnection part, a suitable thickness is 100–500 nm or so. When the recess is not filled up with the plate of such thickness, the polycrystalline Si 81 is deposited as described above, to entirely fill the recess and to flatten surface.

When the polycrystalline Si film 8 left intact is overlaid with the second polycrystalline Si 81 which is thereafter etched over the entire area, the end point of the etching becomes indefinite because both fuse into one at their boundary. Therefore, the surface of the first layer of polycrystalline Si 8 is thermally oxidized by 5–30 nm so as to interpose an SiO$_2$ layer between both the layers. Thus, the SiO$_2$ film on the first layer of polycrystalline Si 8 is exposed in the state in which the second layer of polycrystalline Si has been etched over the entire area. Herein, the plasma etching rate of polycrystalline Si is 10 or more times as high as that of SiO$_2$. Therefore, even when overetching is somewhat performed, the first layer of polycrystalline Si 8 is protected by the SiO$_2$ and is not etched.

Figure 13:
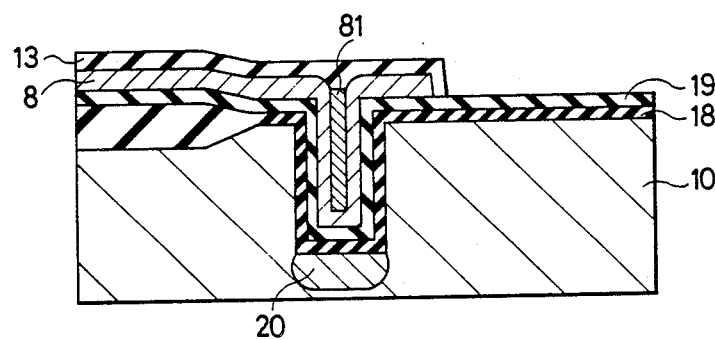
Figure 14:
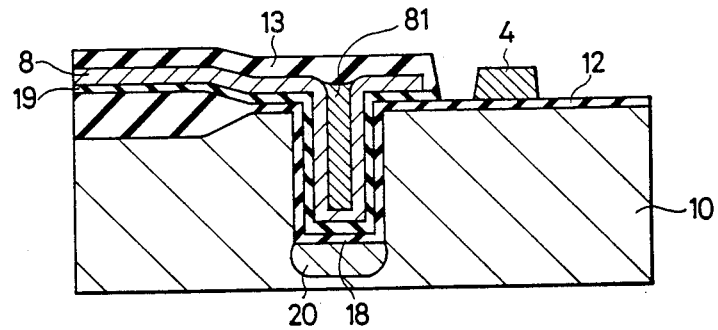

Next, the unnecessary part of the polycrystalline silicon film 8 is removed by the photoetching process so as to finish up the plate 8. Thereafter, as shown in FIG. 13, the surface of the plate 8 is oxidized to form the first inter-layer oxide film 13 which is 100–400 nm thick. At this time, the Si$_3$N$_4$ film 19 is scarcely oxidized. Thereafter, using the first inter-layer oxide film 13 as a mask, the exposed part of the Si$_3$N$_4$ film 19 and the underlying SiO$_2$ film 18 are removed by etching. The exposed surface of the resultant Si substrate 10 is oxidized in an oxidizing atmosphere of dry oxygen at 800°–1150° C. containing 1–5% of HCl, whereby the gate oxide film 12 being 10–50 nm thick is formed. Thereafter, a predetermined dose of boron is ion-implanted in order to attain a desired threshold voltage $V_{TH}$. Subsequently, as shown in FIG. 14, the gates (word lines) 4 each of which is made of a single layer of polycrystalline Si, silicide (e. g., Mo$_2$Si) or the like or stacked films thereof; a refractory metal such as W and Mo; or the like are selectively deposited on predetermined parts.

Figure 15:
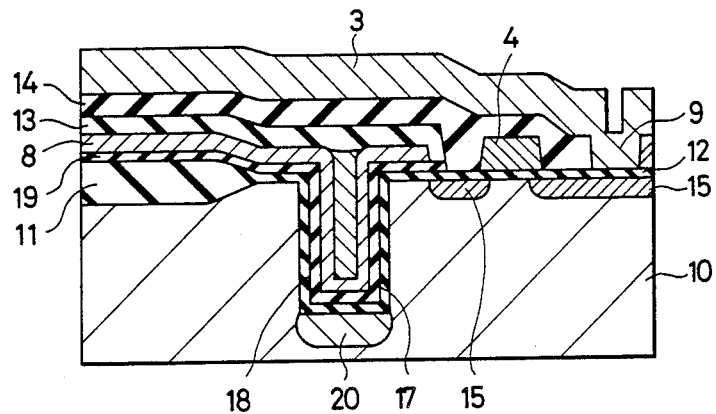

Thereafter, when As or phosphorus is ion-implanted by approximately 5×10$^{15}$–2×10$^{16}$/cm$^2$ at an acceleration voltage of 60–120 keV, the n$^+$-type source and drain layers 15 are formed in the parts on which neither the plate 8 nor the gate 4 is deposited, as shown in FIG. 15. Further, the second inter-layer insulating film 14 which is represented by a CVD SiO$_2$ film containing 4–10 mol-% of phosphorus (abbreviated to CVD.PSG) is deposited to a thickness of 300–1000 nm, and it is heat-treated at 900°–1000° C. so as to be densified. Thereafter, the electrode connection holes 9 which reach the n$^+$ layers 15, gates 4 and plates 8 of the substrate are formed, and the electrodes 3 which are made of a material represented by Al or an Al alloy are selectively deposited. Thus, the 1-transistor type dynamic memory cell is constructed which uses the side wall of the etched recess 17 as a part of the capacitor.

Figure 16:
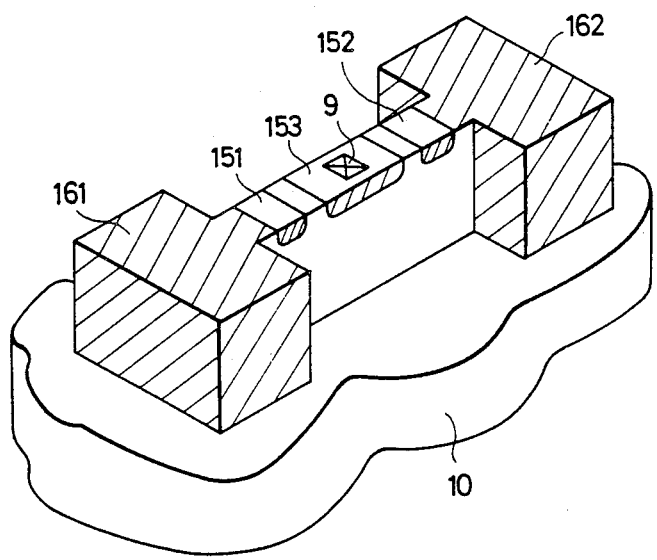
FIG. 16 is a bird's-eye view for explaining the construction of the present invention.
Figure 17:
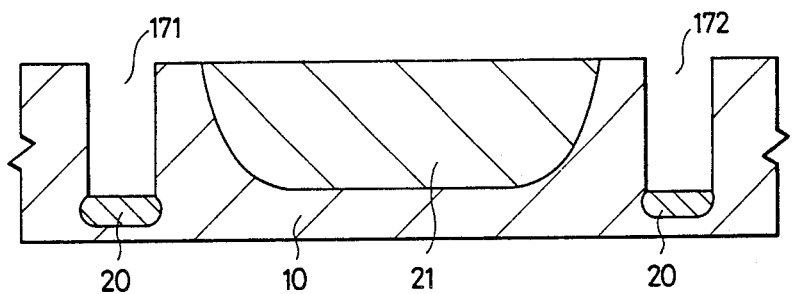
FIGS. 17 and 18 are sectional views showing another embodiment of the present invention.
Figure 18:
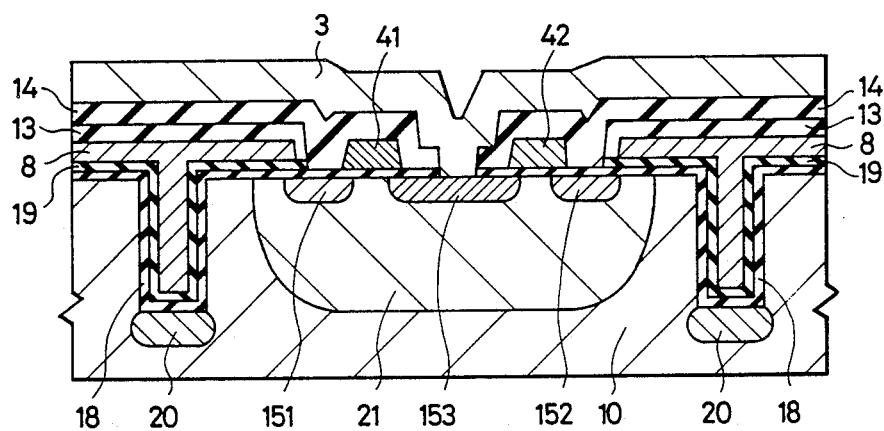

FIG. 16 shows a bird's-eye view of a pair of memory cells formed by this embodiment. While the plan view thereof has been shown in FIG. 6, the word lines, bit lines, plates etc. are omitted from the illustration of FIG. 16 in order to avoid complicacy and to facilitate understanding. The plate 8 is entirely deposited on a pair of capacitor portions 161 and 162. In addition, the plate 8 surrounds the side surfaces of n$^+$ layers 151 and 152 connected to the capacitors 1 among the n$^+$ layers of a pair of switching transistors (e.g. see FIG. 18). Therefore, the capacitor portions 161, 162 and the n$^+$ layers 151, 152, and further the n$^+$ layer 153 connected to the bit line need to be electrically isolated. Since a supply voltage $V_{DD}$ is usually applied to the plate 8, the active region other than the capacitors may be doped with an imp at a density high enough to prevent the side surfaces of layers 151, 152, and 153 from being inverted even at the voltage $V_{DD}$. The inversion voltage $V_{INV}$ differs depending upon the flat band voltage $V_{FB}$, thickness and dielectric constant of the insulating film located between the plate and the substrate, the impurity density of the substrate, etc. By way of example, the voltage $V_{INV}$ becomes about 6 V when the insulating film is an SiO$_2$ film being 300 Å thick and the impurity density of the substrate is 1×10$^{18}$ cm$^{-3}$. In consideration of the voltage $V_{INV}$, any leakage current may be prevented from arising among the n$^+$ layers 151, 153, 152 and the capacitor portions 161, 162. FIG. 17 shows one embodiment of the present invention in which the heavily-doped isolation layer 20 is provided for this purpose. After recesses 171 and 172 (which are united with each other around the active region 7 as shown in FIG. 6, and which surround the pair of memory cells as shown in FIG. 16) have been formed, each isolation well 21 which is a heavily-doped region having the same conductivity type as that of the substrate 10 is formed by the conventional ion implantation followed by annealing at a high temperature (1000°–1250° C.). The impurity density of the isolation well 21 is higher in the surface of the Si substrate, and lower in the bottom part thereof. It may therefore have a value to render the aforementioned voltage $V_{INV}$ sufficiently great, in the bottom part of the lower density. Before or after this step, the bottom parts of the recesses 171 and 172 are also provided with the heavily-doped isolation layer 20 described with reference to FIG. 10. Subsequently, the steps described with reference to FIGS. 11 to 15 are carried out, thereby to obtain the pair of memory cells in which the transistors are formed within the isolation well 21 as shown in FIG. 18. All the n+ layers 151, 152 and 153 are formed within the isolation well 21. Therefore, even when all the side surfaces of the n+ layers 151, 152 and 153 shown in FIG. 18 are surrounded with the plates having the voltage $V_{DD}$ applied thereto, the memory cells can be isolated from each other without any leakage current flowing therebetween.

Figure 19:
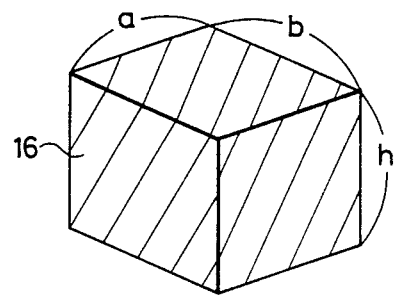
FIGS. 19 to 24 are model views for explaining the shapes of capacitor regions which can be used in the present invention.

The capacitor of the memory cell mentioned in the present embodiment is extracted and is shown in FIG. 19. In order to simplify the explanation, the capacitor is supposed a rectangular parallelepiped, which has an upper surface of a×b and a depth of h. The capacitor area 16 of the flat memory cell in the prior art shown in FIG. 4 is a×b, whereas in the embodiment of the present invention, the capacitor area totals a.b+2 h (a+b) because the side surfaces can be utilized besides the top surface. Assuming that a=b=5 μm and h=2 μm, the capacitor area of the conventional memory cell is $A_{CONV}$=25 μm². In contrast, the capacitor area of the memory cell of the present invention becomes A=65 μm² (=5×5+2×2 (5+5)), and the capacitor area which is several times larger can be readily attained without enlarging the plane area. This also signifies that the present invention can reduce the plane area in case of an equal capacitor area, which can be very advantageous for enlarging the scale of a memory.

Figure 20:
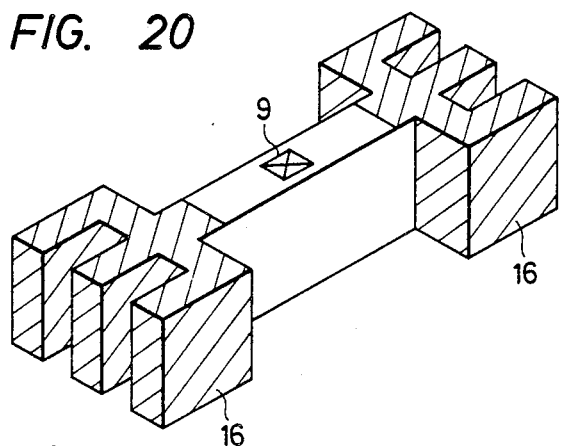
Figure 21:
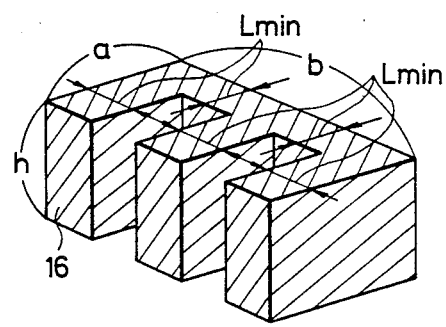

In the embodiments of the present invention thus far described, the capacitor of the memory cell has been basically the rectangular parallelepiped shown in FIG. 19. In the present invention, the side walls of the recess 17 dug in the Si substrate are utilized for the capacitor. Therefore, when the rectangular parallelepiped is formed with interdigitated parts as shown in FIG. 20, the capacitor area A can be more increased. FIG. 21 illustrates an example of calculation of this embodiment. $L_{min}$ is let denote the minimum size of working, and is assumed to be 1 μm. Then, when the values a, b and h are as exemplified in FIG. 19, the upper surface has an area of 17 μm² and the side surfaces have an area of 72 μm², so that the whole capacitor area A becomes A=89 μm². As compared with the embodiment shown in FIG. 19, this embodiment has realized the still larger capacitor area.

Figure 22:
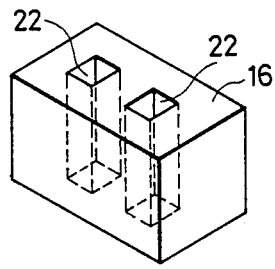
Figure 23:
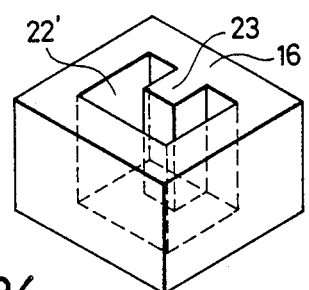
Figure 24:
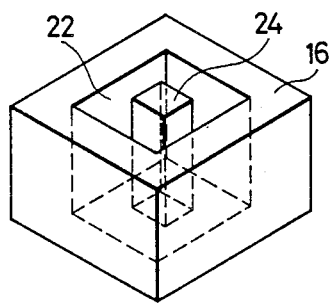

In the present invention, accordingly, the formation of such interdigitated parts or crooks is very effective for further increasing the area of the capacitor. In addition, recesses in various shapes can be used for the capacitor besides the interdigitated parts shown in FIGS. 20 and 21. For example, one or more new recesses may be provided in the rectangular parallelepiped shown in FIG. 19. Such shapes of the capacitor are exemplified in FIGS. 22 to 24. FIG. 22 corresponds to a case where one or even further apertures are formed within the capacitor region 16, FIG. 23 a case where an aperture 22 within the capacitor region 16 has an inward protrusion 23, and FIG. 24 a case where an island-like column 24 exists in an aperture 22. In any case, the dimensions of various parts may be set at the workable minimum value, and the area of the capacitor increases remarkably.

Figure 25:
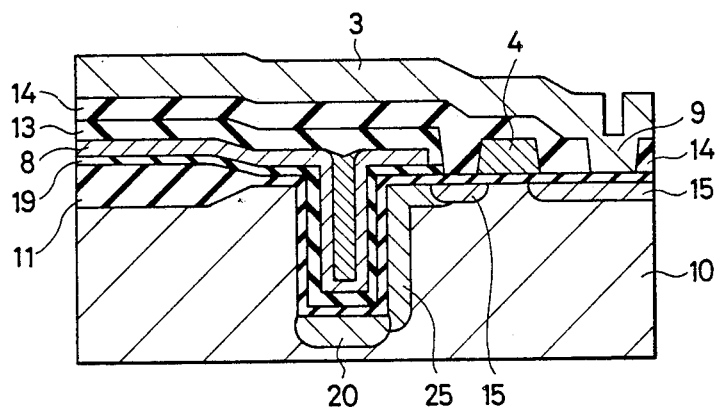
FIGS. 25 and 26 are views showing the sectional structures of the essential portions of another embodiment of the present invention.

All the foregoing embodiments use the inversion layer of the MOS capacitance as the capacitor 1 of the memory cell. Further, another embodiment of the present invention using the capacitor between an n+ layer and the plate 8 is shown in FIG. 25. In this embodiment, after the recesses 17 have been formed by the method illustrated in FIGS. 8 to 10, regions having the same n+ conductivity type as that of the diffused layers 15, namely, capacitor electrodes 25 are formed in selected parts in which the capacitor regions are to be formed, by a well-known expedient such as selective diffusion. In doping the side wall parts of the recess with an impurity, As or P may be implanted obliquely, or the ion sputtering may be utilized deliberately by lowering the acceleration energy to or below 10 keV. It is alternatively allowed to employ the conventional thermal diffusion using $POCl_3$, or to selectively deposit CVD glass containing As or P, from which As or P can be diffused.

The advantage of the present embodiment is that, since the MOS inversion layer is not used, the potential of the plate 8 can be set at any value. By way of example, when this potential is set at the ground potential $V_{SS}$ (=0 V), the inversion voltage $V_{INV}$ can be set at approximately 1 V or less in order to electrically isolate the n+ layers 151, 152 and 153 or the capacitor portions 161 and 162 from one another. In the case of the foregoing voltage $V_{DD}$, the impurity density has been set at $1 \times 10^{18}$ cm$^{-3}$ or above, whereas in the case of this voltage $V_{SS}$, the impurity density may be set at $6 \times 10^{15}$ cm$^{-3}$ or above with the insulating film 300 Å thick. Accordingly, even when the isolation well 21 used in the case of the voltage $V_{DD}$ is not especially formed, the purpose can be achieved by employing a substrate 10 of high impurity density. The system described above shall be called the "$V_{SS}$ plate system" for the sake of convenience.

Figure 26:
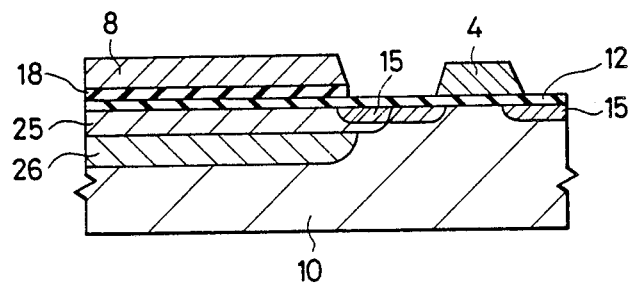

In the $V_{SS}$ plate system, the depletion layer capacitance between the capacitor electrode 25 and the Si substrate 10 is added to the electrostatic capacitance between the capacitor electrode 25 and the plate 8. Thus, a memory as illustrated in FIG. 26 is formed. When the capacitor of the memory is formed in the recess portion in accordance with the present invention, the memory obtained is very excellent. More specifically, a depletion layer under the n+-type capacitor electrode 25 can be made thin in such a way that a heavily-doped capacitor layer 26 having the same p-conductivity type as the substrate is provided under the capacitor electrode 25. The capacitance of the capacitor is inversely proportional to the thickness of the depletion layer, and in turn, the latter is inversely proportional to the square root of the impurity density. Therefore, when the impurity density is made high, the capacitor capacitance increases. The heavily-doped capacitor layers 26 may be formed, immediately before forming the capacitor electrodes 25 by the foregoing method, by similar ion implantation as well as subsequent annealing. When the impurity density is high, breakdown occurs between the capacitor electrode 25 of the n+ layer and the heavily-doped capacitor layer 26. Accordingly, although the maximum density depends upon the potential amplitude of the capacitor electrode 25, it becomes $5 \times 10^{17}$ cm$^{-3}$ when the potential amplitude is supposed 5 V. This applies to the case of a planar junction. When the end part of a junction curves at a small curvature, field crowding takes place at this part, and usually the breakdown voltage lowers. In actuality, therefore, a still lower impurity density is often used.

In the foregoing embodiments, a part of the capacitor 1 and the switching transistor 2 are entirely formed on the surface of the Si substrate. In this case, the capacitor area 16 occupies at most 30–40% of the whole plane area of the memory cell as illustrated in FIG. 6. There will now be described embodiments of the present invention wherein the low occupying percentage of the capacitor area has been changed into approximately 100%. Here, an example utilizing the inversion layer of a MOS capacitor and applying a supply voltage $V_{DD}$ to a plate will be first explained.

Figure 27:
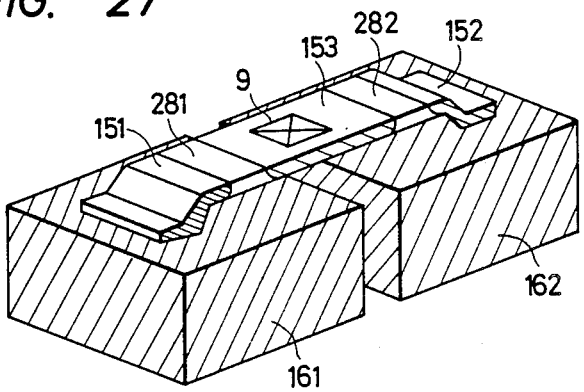
FIG. 27 is a model view for explaining another embodiment of the present invention.

FIG. 27 shows a diagram of the fundamental conceptual structure of the present embodiment. Capacitor regions 161 and 162 are formed within a Si substrate 10. n+ layers 151, 152 and 153 and switching transistor channel portions 281 and 282 are formed in a single-crystal Si film which is deposited and grown on the capacitor regions 161 and 162 through an insulating film (not shown) in a manner to stride over these capacitor regions, that is, in an epitaxial layer which overlies an insulating film (hereinbelow, referred to as "SOI" (Silicon On Insulator)). Thus, the surface part of the Si substrate is fully covered with the capacitor area 16, and the occupying percentage of the capacitor area can be made 100%, which is very advantageous for reducing memory cell area. Hereunder, the present invention will be described with reference to detailed flow diagrams.

Figure 28:
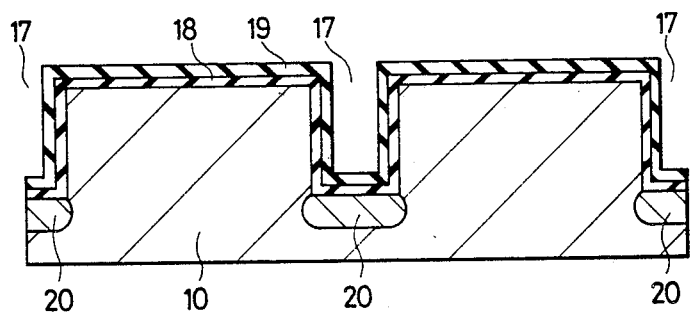
FIGS. 28 to 35 are flow diagrams showing the manufacturing method of another embodiment of the present invention.

First, a thick field oxide film to be used for indirect peripheral parts is formed on the semiconductor substrate by the LOCOS process (in order to avoid complexity, the film shall not be shown in the drawings referred to below), whereupon recesses 17 are formed by the foregoing method. As shown in FIG. 28, a capacitor $SiO_2$ film 18 and a capacitor $Si_3N_4$ film 19 are respectively deposited to thicknesses of 5-50 nm and 5-50 nm. As these films are thinner, the capacitance of the capacitor per unit area becomes larger. These films, however, cause the permanent breakdown when an electric field within them exceeds $1 \times 10^7$ V/cm. In point of the reliability over a long term, therefore, greater thicknesses are more preferable. With thicknesses less than 5 nm, the direct tunnel current gradually becomes predominant. It is therefore difficult to set the thicknesses less than 5 nm. On the other hand, this embodiment utilizes the MOS inversion capacitor. Therefore, it is usually recommended to form heavily-doped isolation layers 20 in the bottoms of the recesses 17 by the ion implantation or the like.

Figure 29:
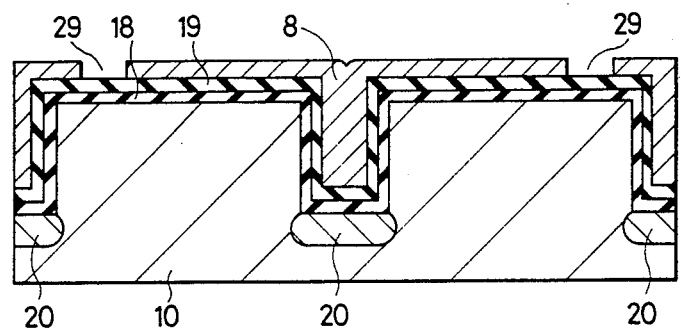

Thereafter, as shown in FIG. 29, a plate 8 made of polycrystalline Si is deposited in a manner to fill up the recesses 17 by the use of the method explained with reference to FIG. 12. Subsequently, using the well-known lithographic process, the plate 8 is formed with substrate connection holes 29 in its parts connecting to the substrate 10.

Figure 30:
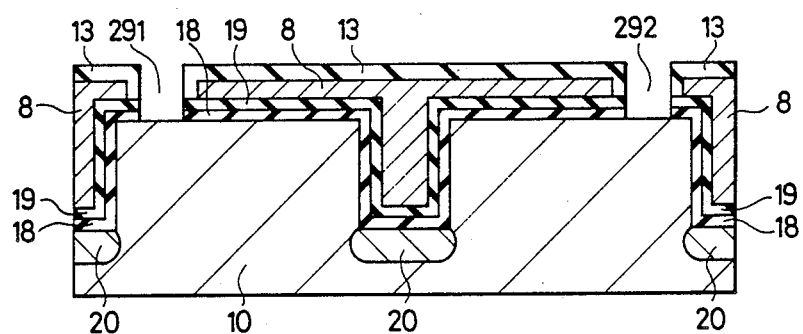

Thereafter, as shown in FIG. 30, the plate 8 is thermally oxidized at 800°-1100° C. for a predetermined period of time so as to form a first inter-layer oxide film 13. At this time, the exposed parts of the $Si_3N_4$ film 19 shown in FIG. 29 are scarcely oxidized. Accordingly, using the first inter-layer oxide film 13 as a mask, the exposed parts of the $Si_3N_4$ film 19 are etched with hot phosphoric acid at 180° C., by the plasma etching employing freon gas, such as $CF_4$, as a principal constituent, or the like. Further, the exposed parts of the capacitor $SiO_2$ film 18 are etched with an HF-system etchant. Thus, holes 291 and 292 are formed. A structure obtained in this way is shown in FIG. 30.

Figure 31:
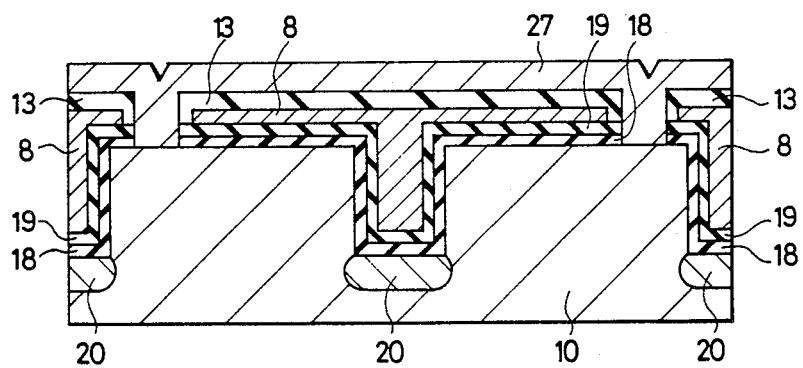

Thereafter, polycrystalline Si is deposited on the whole area by approximately 100-1000 nm by the well-known process employing, e. g., $SiH_4$ or $SiH_2Cl_2$ gas. Subsequently, while the whole Si substrate 10 is held at a predetermined temperature of the room temperature to 1000° C., the entire surface of the polycrystalline Si film is irradiated with the spot of a CW-Ar laser having a diameter of 15-30 μm, under the conditions of an energy level of 5-10 W and a scanning rate of 10-50 cm/sec. Thus, as shown in FIG. 31, the polycrystalline Si film begins to turn into the single crystal from its parts contacting with the Si substrate 10, and the single-crystal Si extending in a range of a radius of 20-50 μm is first formed, so that an epitaxial layer (silicon-on-insulator layer, hereinafter abbreviated SOI layer) 27 is eventually formed on the insulating film 13.

Here, the example which employs the laser annealing resorting to the so-called CW laser has been mentioned. Since, however, the channel portions 28 of the switching transistors 2 may merely be finally turned into the single crystal, various methods such as annealing resorting to a carbon heater and annealing resorting to an electron beam can be employed besides the laser annealing method.

Moreover, the Si film to be single-crystallized by the laser annealing or the like is not restricted to the polycrystalline Si film, but it may well be a film produced by the conventional epitaxial growth at 800°-1200° C. In this case, only the parts of the film in and around the connection holes 29, each part having a diameter of 2-3 μm, become the single crystal, and the surrounding area becomes polycrystalline. Therefore, the whole film or at least the transistor channel parts 28 of the film may be subsequently single-crystallized by the aforementioned annealing.

A large number of processes for growing polycrystalline Si on an insulating film have been proposed, and they can be properly selected and employed in the present invention.

The SOI crystal is more liable to defects than the single crystal, in its interface with the underlying insulating film, and this part sometimes incurs the leakage currents of the transistors which are formed later. It is therefore favorable to dope the vicinity of the surface of the first inter-layer oxide film 13 with boron in advance by the ion implantation or the diffusion of BN, so that the lower surface of the SOI layer 27 may be doped with the boron.

Figure 32:
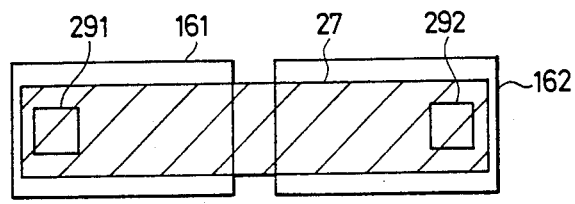

Thereafter, the unnecessary parts of the SOI layer 27 are etched and removed by the well-known photolithographic process so that at least the parts of the layer to form the switching transistors therein may be left behind. A plan view of the resultant structure is shown in FIG. 32.

The etching in this case can employ any of many well-known methods of etching Si. For example, it is possible to perform the wet etching which employs an $HF + HNO_3$ system solution, the plasma etching which employs $CF_4$ or $SF_6$ gas or the like as a principal constituent, or the anisotropic etching which employs KOH, hydrazine or the like exhibiting a low etching rate especially for the (111) plane. Particularly the anisotropic etching has the following advantage. When the SOI layer 27 has the (100) plane as its upper surface, it is formed into the vertical sectional shape of a trapezoid having a wide lower end at about 55 degrees (the angle defined between the (100) plane and the (111) plane). Therefore, the SOI layer comes to have gentle end parts, and the formation of various films to be deposited thereon is facilitated.

Figure 33:
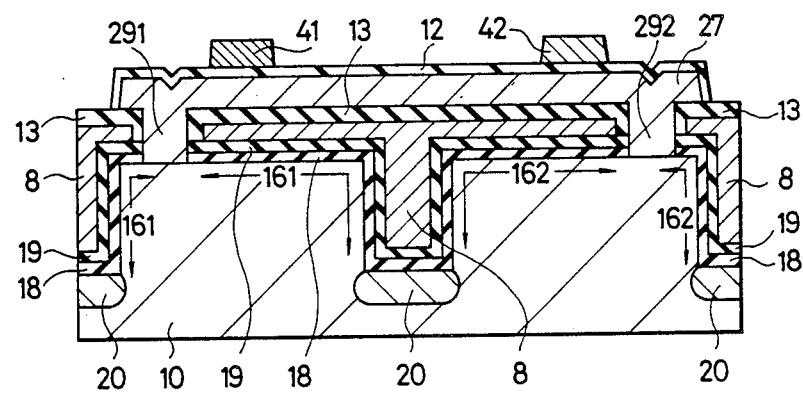
Figure 34:
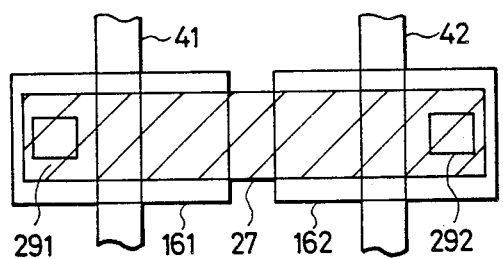

Thereafter, as shown in FIG. 33, a gate oxide film 12 is formed by the well-known thermal oxidation process or the like, and a required amount of boron is ion-implanted thereinto in order to attain a desired threshold voltage $V_{TH}$. Further, word lines 4 (41, 42) are deposited on selected areas. A plan view of the resultant structure is shown in FIG. 34.

Figure 35:
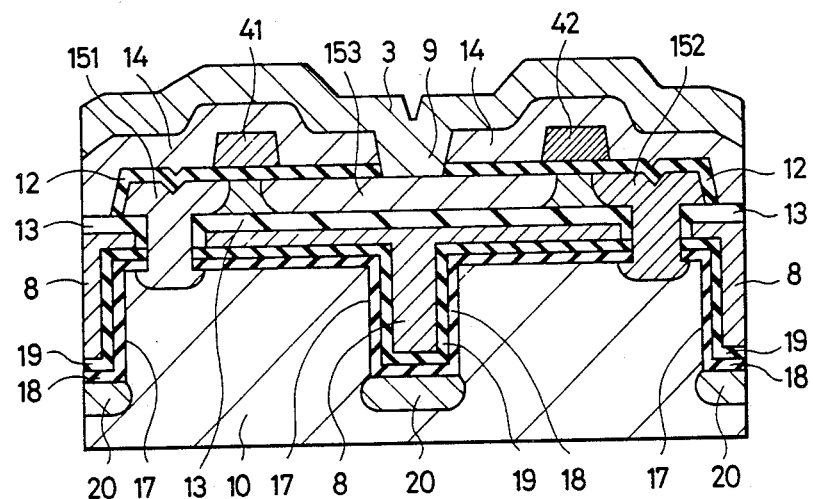

Next, when As or P is ion-implanted at an acceleration voltage of 60-140 keV in a dose of approximately $5 \times 10^{15} - 2 \times 10^{16}/cm^2$ by using the gates (word lines) 41 and 42 of the switching transistors as a mask, n+ source and drain junction layers 151, 152 and 153 are formed as shown in FIG. 35. Further, a second inter-layer insulating film 14 which is typified by a CVD $SiO_2$ film containing 4-10 mol-% of phosphorus (abbreviated to "CVD PSG") is deposited to a thickness of 300-1000 nm, and it is heat-treated at 900°-1000° C. so as to be densified. Thereafter, electrode connection holes 9 which extend down to the n+ layers 151, 152 and 153, gates 41 and 42 and plates 8 are formed, and electrodes 3 which are typified by Al electrodes are deposited on selected areas. Thus, the 1-transistor type dynamic memory cells in which the side walls of the etched recesses 17 are principally utilized for the capacitors can be constructed.

Figure 36:
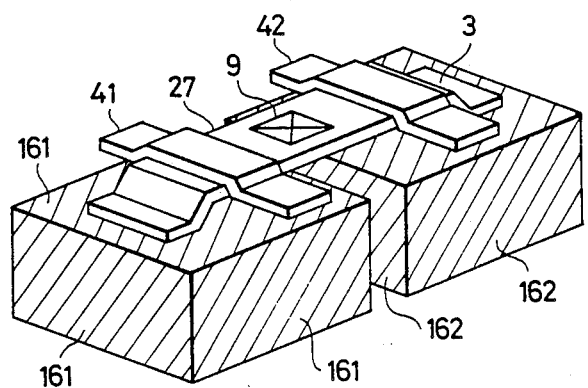
FIG. 36 is a model view showing the structure of a semiconductor memory produced by the manufacturing method of FIGS. 28 to 35.

FIG. 36 shows a bird's-eye view of the memory cells of this embodiment. Only the capacitor portions 161, 162, the SOI film 27, the connection hole 9, the word lines 41, 42 and the bit line 3 are extracted and illustrated in order to avoid complicacy.

Figure 37:
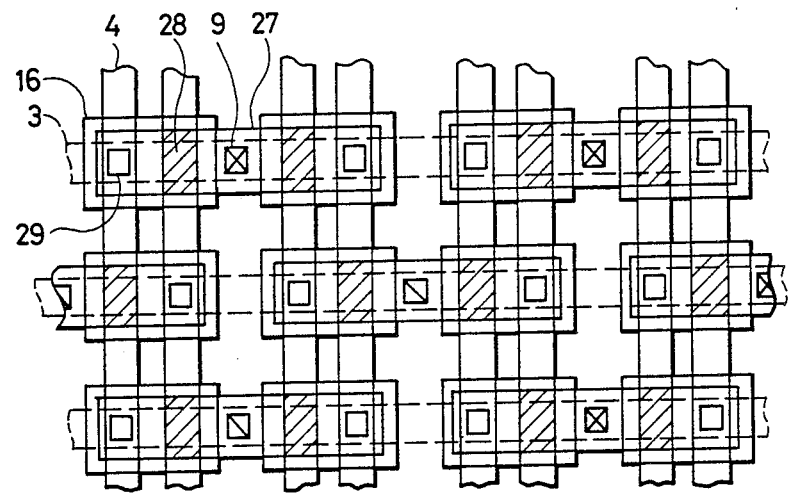
FIGS. 37 and 38 are views for explaining the arrayals of memory cells.

In putting such pairs of memory cells into a plurality of arrays, they may be arranged as shown in FIG. 37 by way of example. In order to avoid complicacy, the figure shows only the SOI portions 27, word lines 4, bit lines 3, capacitor regions 16, substrate connection holes 29, contact holes 9, and the transistor channel portions 28 which are hatched.

Figure 38:
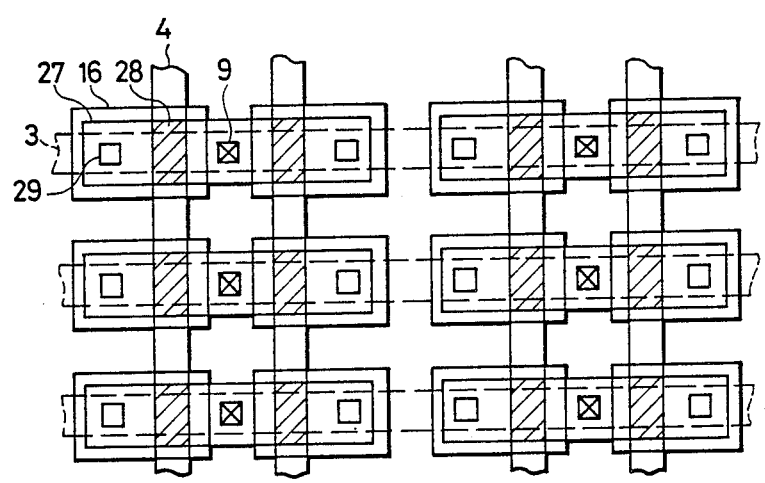

While this embodiment is of the folded bit line arrangement, an embodiment of the present invention for the open bit line arrangement is shown in FIG. 38. The open bit line arrangement may be a half in the number of arrayal of the word lines 4 as compared with the folded bit line arrangement. Therefore, when only this point is noted, the former is advantageous, but it has the disadvantage that noise to hamper the normal operation of the circuitry is relatively great.

In the present embodiment, after the desired parts of the Si film formed on the insulating film have been single-crystallized, the unnecessary parts are removed. However, it can be similarly performed that after the polycrystalline Si has been deposited on the whole area, the unnecessary parts are first removed, whereupon the desired parts are single-crystallized by the foregoing laser annealing or the like.

Figure 39:
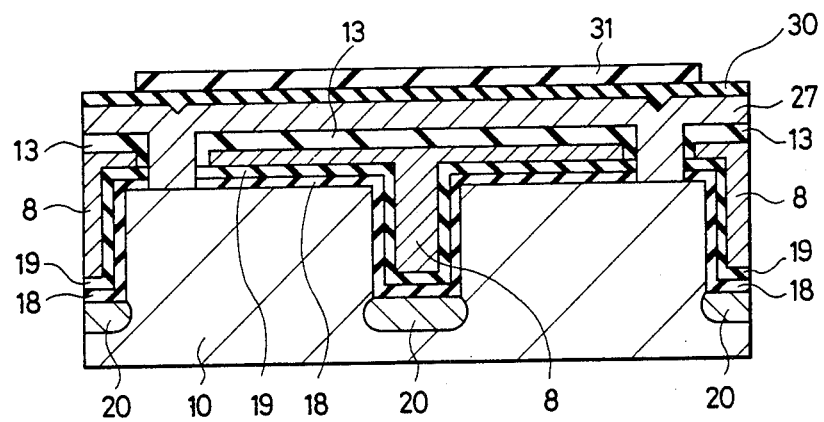
FIGS. 39 to 41 and FIGS. 42 to 44 are flow diagrams showing different manufacturing methods of semiconductor memories according to the present invention, respectively.

While, in the present embodiment, the unnecessary SOI parts have been removed, such unnecessary parts may be partially turned into an oxide film as in another embodiment of the present invention to be stated next. After the structure shown in FIG. 31 has been formed, an underlying $SiO_2$ film 30 being 1-50 nm thick is formed in a required area, and an $Si_3N_4$ film 31 as a LOCOS mask being 50-200 nm thick is deposited on selected parts thereof, as illustrated in FIG. 39.

Figure 40:
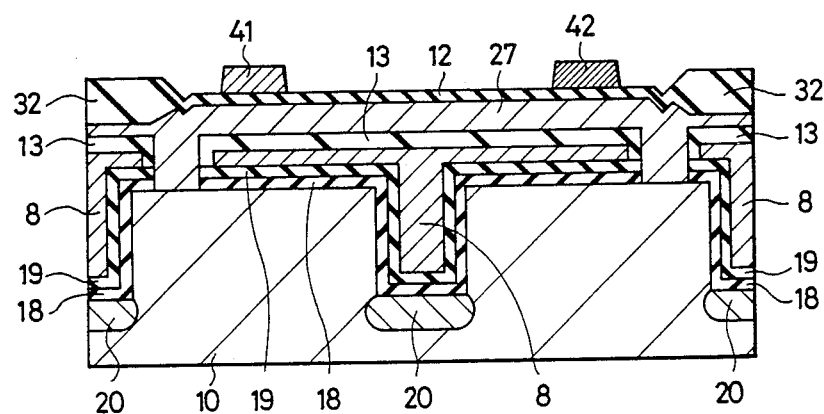

Thereafter, as shown in FIG. 40, a desired SOI field oxide film 32 is formed by the wet oxidation at a temperature of 800°-1100° C. When, herein, the SOI layer 27 is to be somewhat left under the SOI field oxide film 32, the field oxide film 32 may be formed after channel stoppers have been formed by ion-implanting boron into the exposed parts of the SOI film 27 by usually employing the $Si_3N_4$ film 31 as a mask as in the well-known LOCOS process. Thereafter, the $Si_3N_4$ film 31 and the $SiO_2$ film 30 are removed, whereupon as shown in FIG. 40, the gate oxide film 12 is formed and the word lines (the gates of the switching transistors) 41 and 42 are selectively deposited.

Figure 41:
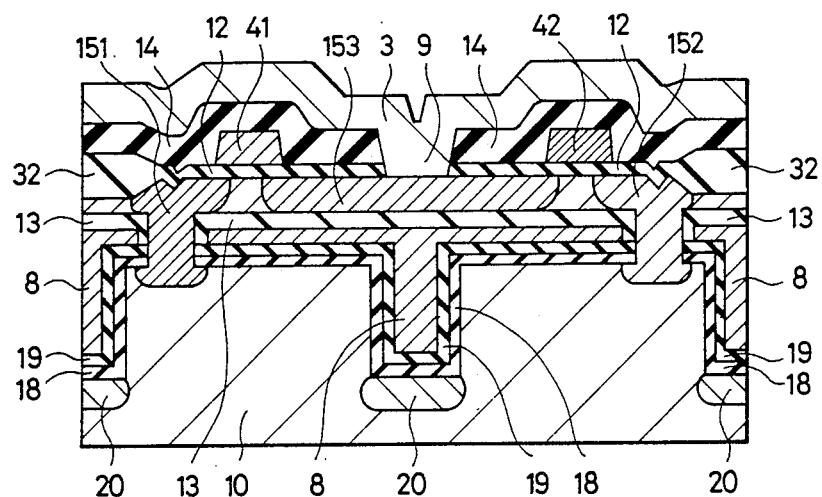

Subsequently, via the formation of the sources and drains as shown in FIG. 35, the second inter-layer insulating film 14, contact holes 9 and bit lines 3 of Al are formed or selectively deposited as shown in FIG. 41. Then, the memory cells are formed.

Since, in the present embodiment, the unnecessary parts of the SOI layer are changed into the oxide film, the steps of the substrate surface are smaller than in the case of removing the unnecessary SOI layer. This is advantageous for the formation of various films to be deposited on the steps. Another advantage is that, since the field $SiO_2$ film 32 exists, the parasitic capacitance between the SOI layer and the underlying plate 8 or Si substrate 10 becomes small.

In the embodiments of the present invention thus far described, the bit line 3 is electrically connected to one pair of memory cells through the single contact hole 9 as shown in FIG. 37. In this case, the contact hole 9 must be formed between one pair of confronting word lines. This necessitates to form the contact holes between the confronting word lines with pattern alignment margins. When the memory cells are fined, the alignment margins become unnegligible, and besides, they form a serious hindrance.

Figure 42:
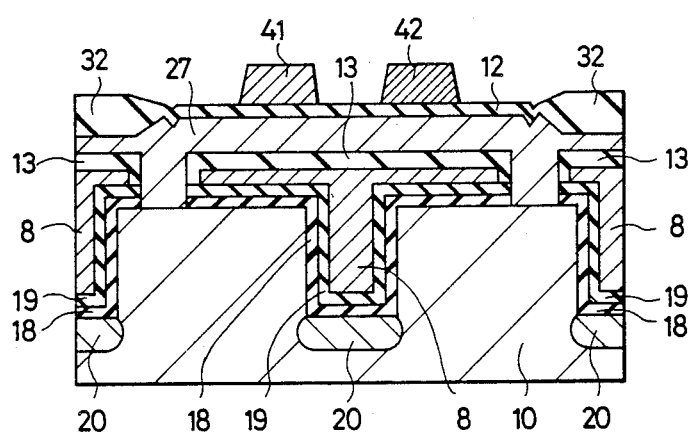
Figure 43:
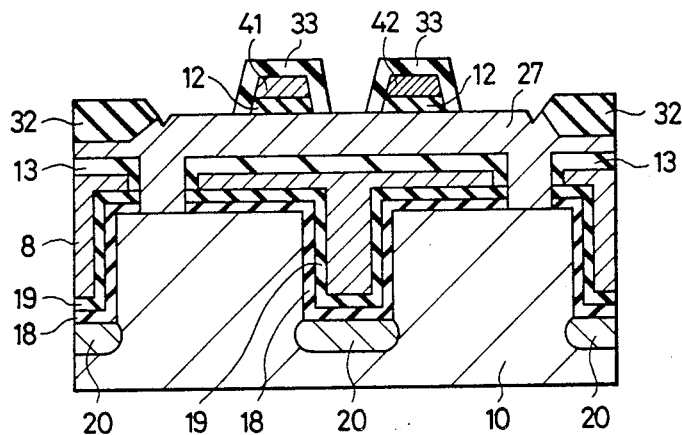

An embodiment to be described below renders the mask alignment margin zero in principle. As shown in FIG. 42, word lines 41 and 42 made of polycrystalline Si are formed at the interval of the minimum working dimension attainable by the lithographic technique. At this time, the polycrystalline Si is doped with phosphorus or/and As at a density of $5 \times 10^{20} - 2 \times 10^{21}$ cm$^{-3}$ in advance. Thereafter, the wet oxidation is performed in an atmosphere containing steam at 700°-950° C. Then, since the oxidation rate is higher at a higher impurity density, a thick oxide film is formed on the word lines 41 and 42 made of the polycrystalline Si, and a relatively thin oxide film is formed on an SOI film 27. Subsequently, the oxide films are etched uniformly over the entire area until the oxide film on the SOI film 27 is removed. Then, as shown in FIG. 43, the oxide film 33 still remains on the word lines 41 and 42 made of polycrystalline Si though it has been thinned by the etching, in a manner to cover only the word lines 41 and 42 made of polycrystalline Si, whereas the surface of the SOI film 27 is exposed.

Figure 44:
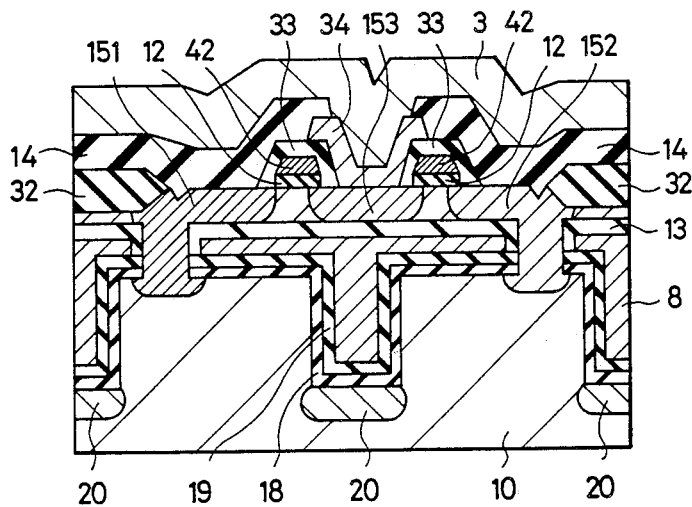

Next, as shown in FIG. 44, n+ layers 151, 152 and 153 are formed by the ion implantation of P or As in order to form sources and drains, and an underlying polycrystalline Si film 34 is deposited selectively on only the n+ layers 153, whereupon a second inter-layer insulating film 14 is deposited. Further, contact holes extending down to the underlying polycrystalline Si film 34 are formed, and bit lines 3 are deposited on selected parts. Then, memory cells are formed.

As understood by comparing the distance between the word lines 41 and 42 in FIG. 41 and the distance between the word lines 41 and 42 in FIG. 41, the distance between the word lines can be made very small in accordance with the present embodiment.

In the present embodiment, the polycrystalline Si has been covered with the oxide film of its own in self-alignment fashion by utilizing the difference between the impurity densities of the polycrystalline Si and the SOI layer. However, when an $Si_3N_4$ film is deposited beforehand on a gate oxide film 12 shown in FIG. 42, the same structure can be realized without utilizing the difference of the impurity densities. This is the same method as that illustrated in FIG. 13. Even when the polycrystalline Si 41, 42 is oxidized, the SOI layer 27 is not oxidized because of the Si₃N₄ film deposited thereon, so that only the polycrystalline Si is formed with the covering oxide film 33. The subsequent steps are the same as in the foregoing embodiment. The final structure obtained differs from the structure shown in FIG. 44, only in that the portion of the gate oxide film 12 consists of the twO layers of the gate oxide film 12 and the Si₃N₄ film deposited thereon. The other portions are the same.

Any of the foregoing embodiments has the n+ layer 153 common to one pair of memory cells, and the bit line 3 of Al is connected thereto through the contact hole 9. As another embodiment of the present invention, there will be mentioned a case where a single bit line 3 is connected to at least two pairs of memory cells through one contact hole 9.

Figure 45:
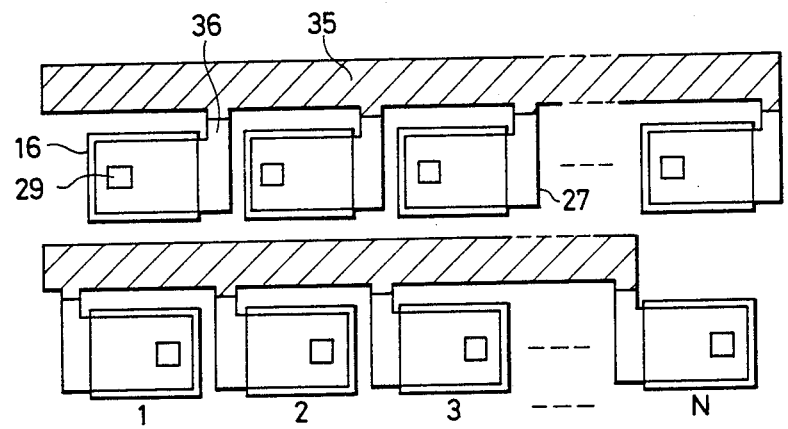
FIGS. 45 to 47 are diagrams for explaining connections in the present invention.
Figure 46:
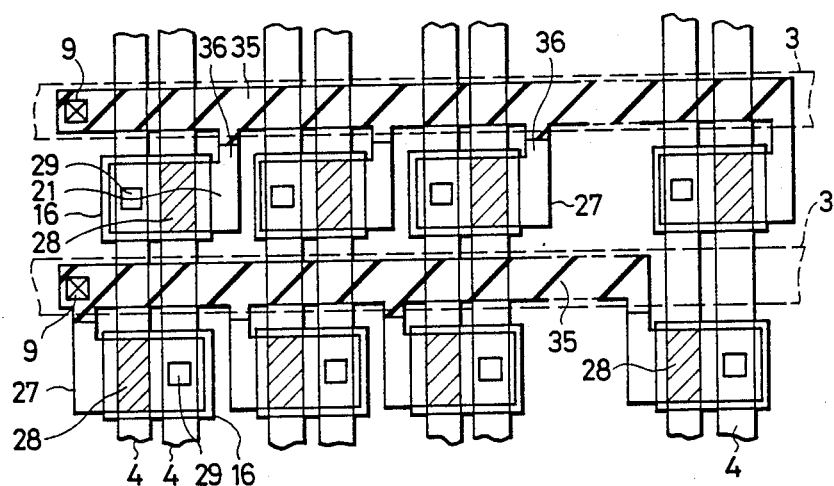

As shown in plan in FIG. 45, an SOI layers 27 is selectively formed on capacitor regions 16 through substrate connection holes 29. (Alternatively, an SOI layer may be deposited on the whole area and then have its unnecessary parts turned into a field oxide film by the LOCOS process, as described before.) At this time, the capacitor portions 16 at 1, 2, . . . and N are connected by the lead-out portions 36 of the SOI layer 27. Thereafter, the connection portion of the SOI layer is doped with the ions of P, As or the like by the well-known ion implantation or diffusion process so as to form an n+ layer, which is used as a bit line 35 shown in FIG. 45. The reason why the connection portion of the SOI layer is turned into the n+ layer in advance, is that the portion is not doped with P or As even at the step of forming sources and drains because word lines to stride over the portion act as a mask. Thereafter, the word lines 4 and bit lines 3 may be formed as shown in FIG. 46 by, e. g., the method illustrated in FIGS. 31–35. Since only one contact hole 9 suffices for N memory cells, the embodiment makes it unnecessary to set the alignment margins for the individual memory cells in order to form the contact holes 9 and is suited to an enhanced density of integration.

Figure 47:
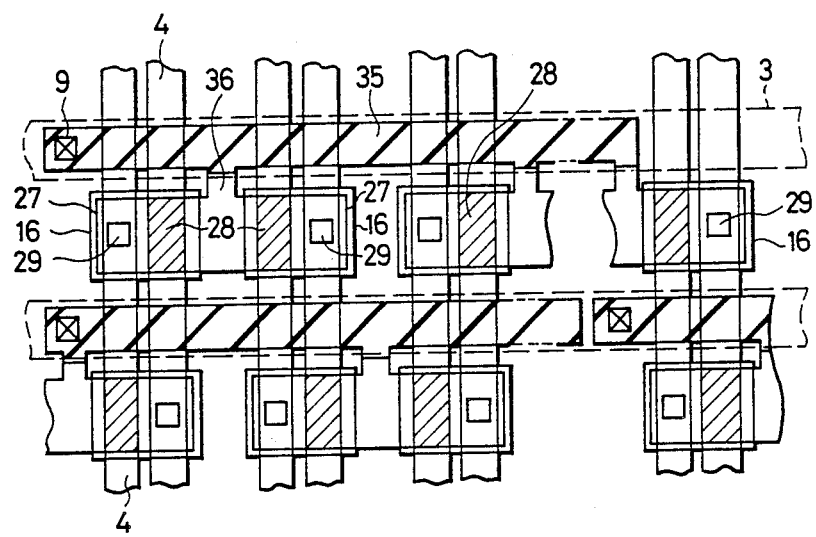

In the present embodiment, the lead-out portions 36 of the SOI layer are provided for the respective memory cells. However, when one lead-out portion 36 is provided for a pair of memory cells as in another embodiment shown in FIG. 47, an area used for the lead-out portions decreases to that extent, which is suited to an enhanced density of integration.

Here, the N memory cells are connected with the bit line 3 by the single contact hole 9. However, when the number of all memory cells to be connected with one bit line is N, the other bit lines made of Al are dispensed with. Accordingly, it becomes unnecessary to perform the Al wiring on the memory cells, so that the formation of a memory LSI is facilitated. Since Al is deposited in a place close to the uppermost layer of the memory LSI, the working precision of the Al is lowered by the unevenness of an underlying layer, and moreover, the disconnection of the Al arises at an abrupt step. In the working of the LSI, therefore, the Al is a material which is the most difficult of patterning. Accordingly, dispensing with the Al wiring on the memory cells is very effective for enhancing the reliability of the semiconductor device.

The memory cells employing the foregoing SOI layer has advantages to be stated below. Since the switching transistor portions and the bit line exist in the thin SOI layer, the rate of creating electron-hole pairs within the SOI layer is low in spite of the entrance of α-particles, which is advantageous in point of α-particle immunity. In addition, since the drain portion 153 of the switching transistor is deposited on the thick oxide film 13, the parasitic capacitance $C_D$ of the bit line is small. The signal-to-noise ratio (S/N ratio) of a memory is substantially proportional to the ratio $C_S/C_D$ between the capacitor value $C_S$ and the aforementioned $C_D$. In this regard, according to the present invention, $C_S$ can be made large and $C_D$ small, so that the $C_S/C_D$ ratio becomes very great, and the operating margin of the memory is remarkably improved.

Figure 48:
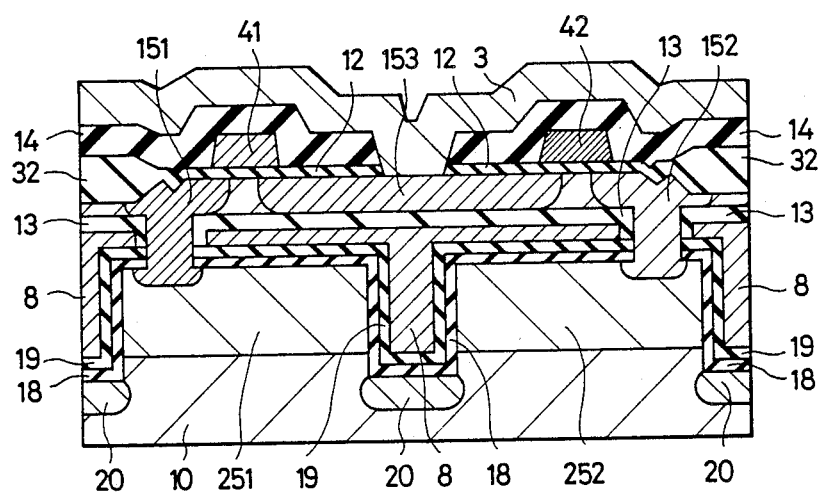
FIGS. 48 and 49 are views each showing the sectional structure of the essential portions of an embodiment of the present invention.

While, in the above, the embodiments of the memory cells employing the SOI layer have been referred to, they all utilize the MOS inversion layer. However, as already illustrated in FIGS. 25 and 26, the n+ layer can be used instead of the MOS inversion layer. An embodiment wherein capacitors formed by the use of n+ layers are applied to memory cells of the structure shown in FIG. 41, is illustrated in FIG. 48. Capacitor electrodes 251 and 252 made of the n+ layers can be formed in advance by performing the conventional ion implantation or diffusion to a desired thickness over the entire area of a Si substrate 10 in which the memory capacitors are to be formed, before recesses 17 are formed. Alternatively, after an Si₃N₄ film 19 which is the insulating film of the capacitors has been formed, the n+ layers 251 and 252 can be formed in predetermined parts by the ion implantation. In the course, the capacitor electrodes 25 can be formed before or after any step.

With the capacitor electrodes 251 and 252, $V_{SS}$ (earth potential) can also be applied to the plates 8 as has already been described in the example of FIG. 25. In this case, the heavily-doped isolation layer 20 is unnecessary when the selected impurity density of the substrate is sufficiently high.

The highest level of energy of α-particles emitted from a package or the like is about 4 MeV due to U or Th. When they enter vertically, electron-hole pairs to appear within the Si substrate are created most at a depth of about 20 μm from the uppermost surface. This is not always true because the α-particles enter obliquely actually. Anyway, however, the performance of α-particle immunity is enhanced by removing electrons which appear in a region below a thickness of several μm.

Figure 49:
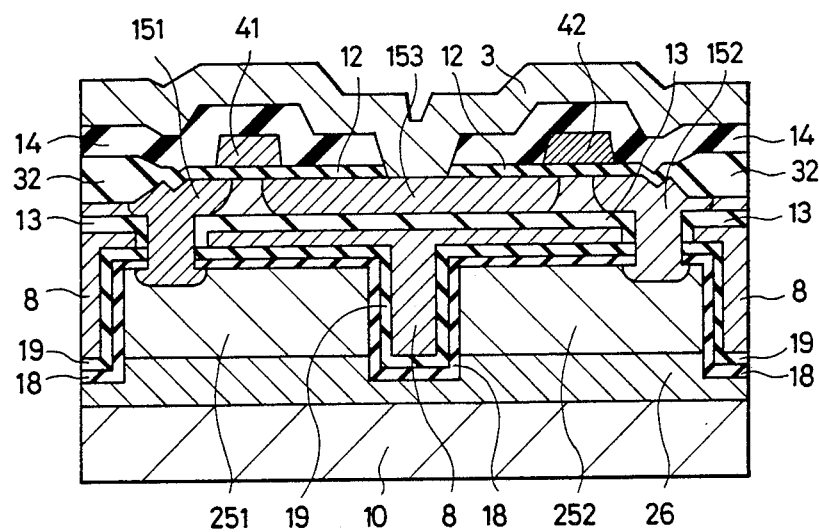

Accordingly, when a heavily-doped capacitor layer 26 of the p-conductivity type is disposed under the n+-type capacitor electrodes 251 and 252 as shown in FIG. 49, it serves as a barrier against the electrons generated by the α-particles, and besides, the increase of a depletion layer capacitance owing to the contraction of a depletion layer is attained as in the embodiment shown in FIG. 26, so that $C_S$ is further increased.

When, to the end of relieving the influences of the electrons and holes attributed to the α-particles, that junction shown in FIG. 49 which is defined by the n-type substrate 10 and the heavily-doped layer 26 is reverse-biased (with the n-type region held at a plus potential, and the p-type region at a minus potential) and the electrons and holes created within the depletion layer of the Junction are allowed to run into this junction as a current, the performance of α-particle immunity is more enhanced.

When the Si substrate 10 is made still higher in the impurity density than the heavily-doped layer 26, the probability at which the electron-hole pairs created within the substrate are recombined by themselves to disappear rises, so that the performance of α-particle immunity is enhanced. In this case, a p-type layer may be grown on a p$^+$-type Si substrate by the epitaxial growth process and used as the substrate of the memory cells.

Figure 50:
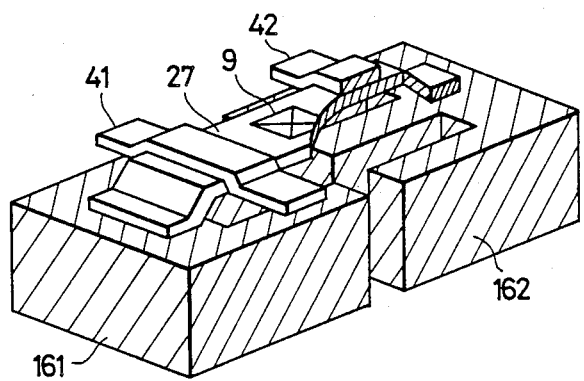
FIG. 50 is a model view for explaining the structure of an embodiment of the present invention.
Figure 51:
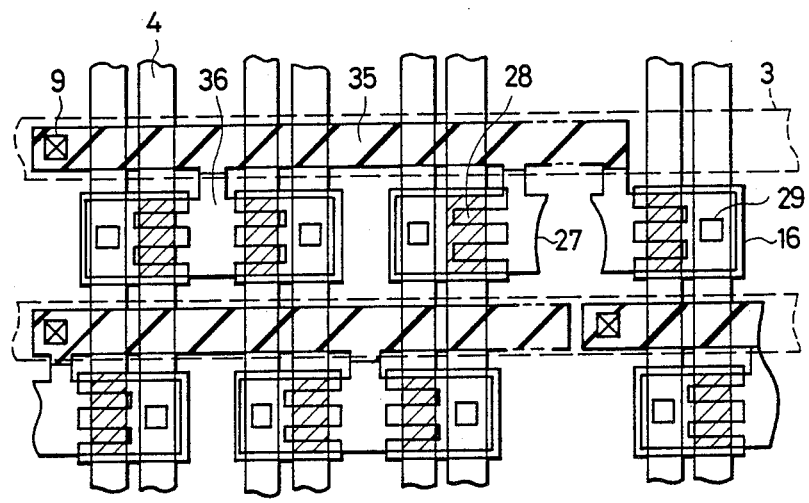
FIG. 51 is a diagram for explaining an example of the plane configuration of the present invention.

In the above description of the embodiments employing the SOI, the capacitor has been shaped into the rectangular parallelepiped as shown in FIG. 27. When it is formed with the interdigitated parts at the minimum workable dimension $L_{min}$ as shown in FIGS. 20–24, the capacitor area, in turn, the capacitance $C_S$ can be sharply improved similarly. FIG. 50 shows a bird's-eye view of such situation, while FIG. 51 shows a plan view thereof. When one side of the capacitor region 16 is 2–3 or more times greater than $L_{min}$ yet, the interdigitated parts can be always formed.

Figure 52:
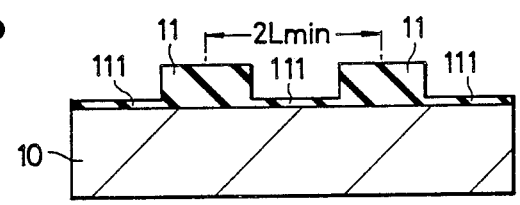
FIGS. 52 to 59 are flow diagrams for explaining a method of forming narrow recesses.

In an embodiment to be described below, recesses for capacitors can be formed at a pitch which is equal to double the minimum workable pitch. As shown in FIG. 52, field SiO$_2$ films 11 being 100–1000 nm thick are formed at a working pitch of 2 $L_{min}$. To this end, it may be carried out to form a thick SiO$_2$ film over the whole area, to remove the unnecessary parts thereof by the dry etching, and to thereafter form a thin SiO$_2$ film 111 over the entire area.

Figure 53:
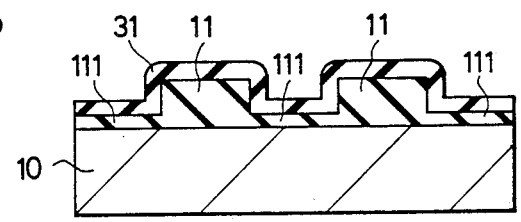
Figure 54:
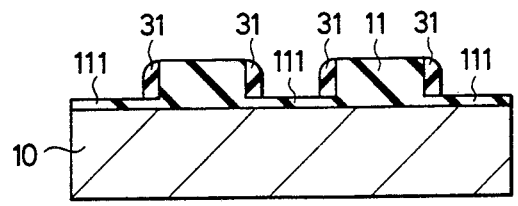
Figure 55:
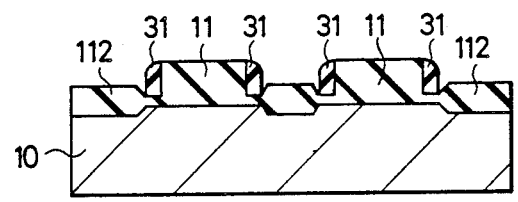

Next, as shown in FIG. 53, a LOCOS Si$_3$N$_4$ film 31 being 50–1000 nm thick is deposited. Thereafter, when the Si$_3$N$_4$ film 31 is entirely dry-etched, it is left at the end parts of the field oxide films 11 as shown in FIG. 54 because the etching is directional.

Figure 56:
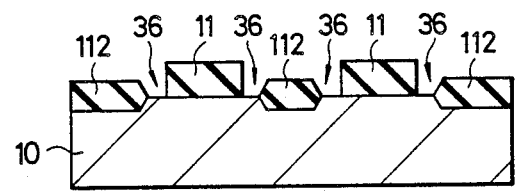
Figure 57:
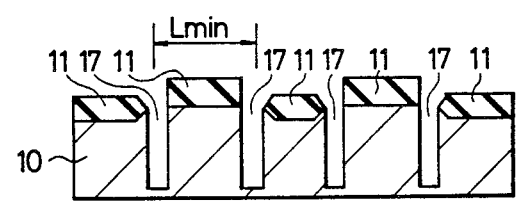

Thereafter, an SiO$_2$ film being 100–1000 nm thick is formed by the thermal oxidation processing, to form a thick field oxide film 112 in the parts of those thin oxide film 111 on the Si substrate 10 on which the Si$_3$N$_4$ film 31 is not deposited. Next, as shown in FIG. 56, the Si$_3$N$_4$ film 31 is removed, whereupon the thin oxide film 111 is removed by etching. Thus, grooves 36 are formed. When the resultant Si substrate 10 is dry-etched by employing the SiO$_2$ films 11 and 112 as a mask, etched recesses 17 are formed in the Si substrate 10 as shown in FIG. 57. At this time, the pitch of the etched recesses becomes $L_{min}$, which is a half of the pitch 2 $L_{min}$ of the initial field oxide film mask shown in FIG. 52. It is easy to form the etched recess 17 which is about 100 nm and about 5 μm deep. In order to expand the width, the thickness of the Si$_3$N$_4$ film 31 may be increased. Even in case of a fine recess, the width can be expanded with an HF-HNO$_3$ system etchant after the dry etching. While the dry-etched Si surface is usually prone to contamination or crystal defects, the wet etching is excellent in that the layer liable to the defects or contamination can be removed.

Figure 58:
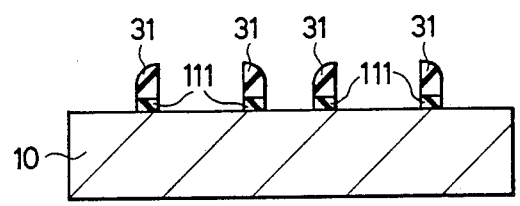
Figure 59:
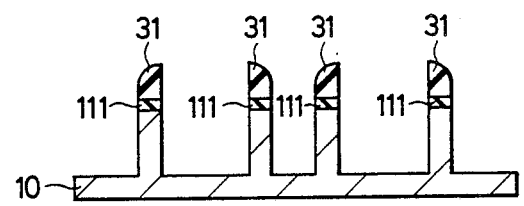

In the present embodiment, there has been mentioned the method which utilizes the thickness of the Si$_3$N$_4$ film 31 in order to form the narrow recesses for the capacitors. Basically, however, the mask material of the dry etching may be left on edges worked beforehand. By way of example, after the processing by the steps shown in FIGS. 52–54, the SiO$_2$ films 11 and 111 are etched and removed. Then, only the Si$_3$N$_4$ film 31 and underlying SiO$_2$ film 111 are left as shown in FIG. 58. Thereafter, the exposed part of the Si substrate 10 is subjected to the dry etching which etches the Si substrate 10 but not the Si$_3$N$_4$ film 31. Then, as shown in FIG. 59, a pattern inverse to the pattern of FIG. 57 is obtained, and substrate parts underlying the Si$_3$N$_4$ film 31 are left unetched. Accordingly, mask materials which include the aforementioned Si$_3$N$_4$ can be properly selected and used in consideration of the etching rates of various films in dry etching operations.

The foregoing embodiments have been selected from among a large number of choices or processes. The respective steps can accordingly be variously modified, but all are common in the point that the side walls of the recess formed in the substrate are utilized as a part of the capacitor. For example, with the method of forming the substrate connection hole illustrated in FIGS. 29–30, the upper layer of the capacitor insulating film is formed of the Si$_3$N$_4$ film 19, which is not oxidized in case of oxidizing the plates 8 of polycrystalline Si. It is therefore utilizable in the present invention.

Figure 60:
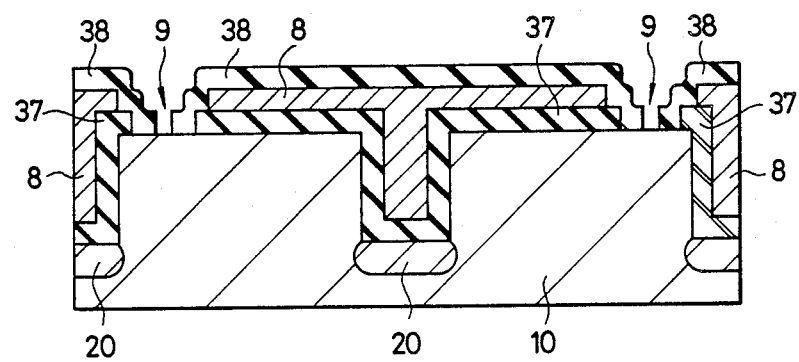
FIG. 60 is a sectional view of an embodiment.

By way of example, when as shown in FIG. 60, a capacitor insulating film 37 is formed of a non-oxidation-resisting film such as of Ta$_2$O$_5$ and NbO which cannot endure processing performed in an oxygen atmosphere at a temperature of 800°–1000° C., the first inter-layer insulating film cannot be formed by oxidizing the polycrystalline Si plates 8. Therefore, an oxidation-proof first inter-layer insulating film 38 which is typified by an Si$_3$N$_4$ film is deposited in a manner to cover the end parts of the non-oxidation-proof capacitor insulating film 37 as illustrated in FIG. 60. At this time, the substrate connection holes 9 require pattern alignment separately from the holes of the plates 8 and the non-oxidation-proof insulating film 37, and alignment margins are required among these holes. The same method can also be adopted in the case of the oxidation-proof capacitor insulating film.

Figure 61:
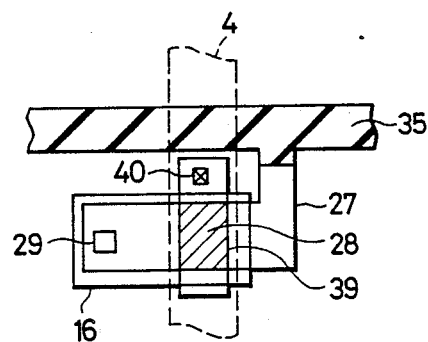
FIG. 61 is a view for explaining an example of connection in the present invention.

In addition, the present invention has been described as to the case where the word line 4 is the gate continuous within the memory cell array. As shown in FIG. 61, however, one or more transfer gates 39 of polycrystalline Si within memory cells may well be connected by the word line 4 of Al through contact holes 40. Thus, a memory can be obtained which has both a high reliability possessed by a polycrystalline Si gate having hitherto been often used and a fast switching operation based on the low resistance of Al. FIG. 61 illustrates the case of the embodiment shown in FIG. 46, but this measure is also applicable to cases other than the embodiment.

In the present invention, the side walls of the recess dug in the substrate are utilized as a part of the capacitor. Therefore, the capacitance $C_S$ may be further increased in such a way that any portion other than the recess of the substrate, for example, a substrate surface portion or a hitherto-known laminated capacitor constructed of polycrystalline Si—Si$_3$N$_4$ film—polycrystalline Si is formed on the substrate surface and is connected in parallel with the capacitor formed at the side wall portion of the recess.

Figure 62:
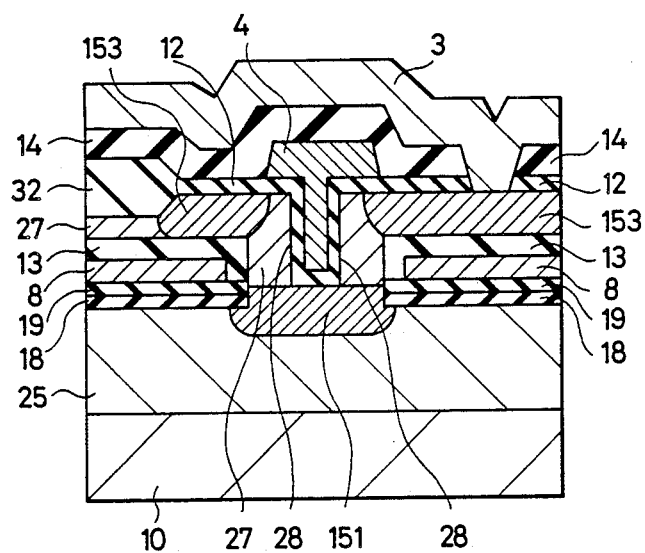
FIG. 62 is a view showing the essential portions of the sectional structure of another embodiment.

While the switching transistor has been formed within the SOI layer in parallel with the Si substrate, the transistor channel portion 28 can also be formed in the vertical direction of the SOI layer 27 as shown in FIG. 62. This vertical channel transistor is applicable to all the memory cells employing the SOI layer as described above.

While the present invention has been described in connection with the n-channel type MOS transistors, the p-channel type can be realized by employing impurities which reverse the conductivity types of all the impurities, as described before. Phosphorus or As may be replaced with B or Al, and B with phosphorus, As, Sb or the like.

The present invention has thus far been described in detail in conjunction with the embodiments. In the present invention, when the switching transistors are formed on the substrate surface, the capacitor capacitance $C_S$ can be increased 2 to 3 times greater than that of the prior-art memory cell, subject to equal plane areas, and when they are formed in the SOI layer, it can be increased several times. In actuality, the recesses are not shaped into perfectly straight planes but are somewhat rounded, and the resolution of the lithography degrades in fine parts. For this reason, even when the designed shape is a regular square, the recess sometimes becomes a shape close to a circle. Even in this case, however, the decrease of $C_S$ is at most 10–20%, and a far greater value of $C_S$ than in the prior art is attained.

The malfunction of a dynamic memory attributed to α-particles is often improved by one order or more when $C_S$ increases by only 10%. Therefore, the double or more increase of $C_S$ raises the reliability of the memory of the particular scale and also makes it possible to realize the memory of a larger scale.

What is claimed is:

1. A semiconductor random access memory which is formed in a semiconductor substrate comprising:
    a plurality of memory cells each of which includes a capacitor for storing information and an insulated gate field effect transistor for reading out the information stored in said capacitor, wherein each of the insulated gate field effect transistors has a channel region formed in a vertical direction perpendicular to a first main surface of the semiconductor substrate;
    word lines for applying signals to a gate electrode of each of the insulated gate field effect transistors;
    bit lines for reading out the information stored in said capacitors,
    wherein the capacitors each include a capacitor electrode formed in said substrate, and a capacitor plate provided with a constant voltage,
    wherein one of the source or drain regions of each of the insulated gate field effect transistors is electrically connected to the capacitor electrode of the respective capacitor, each of the gate electrodes of the insulated gate field effect transistors is electrically connected to the respective word line, and the other of the drain or source regions of each of the insulated gate field effect transistors is electrically connected to the respective bit line;
    a capacitor insulating film formed between the capacitor electrode and the capacitor plate,
    wherein each of said insulated gate field effect transistors is formed to include a first region in contact with the capacitor electrode to serve as a source or drain region for said insulated gate field effect transistors;
    a gate insulating film extending vertically over said first region to define a groove formed by an inner sidewall of the gate insulating film;
    a gate electrode formed in said groove to be separated from the first region by the gate insulating film; and
    a second region formed above the first region and along an outer sidewall of said gate insulating film to be in contact with the first region and isolated from the gate electrode by the gate insulating film, wherein said second region serves as said channel region, and
    wherein at least a portion of each of said insulated gate field effect transistors is formed on at least a portion of the respective capacitor.

2. A semiconductor random access memory according to claim 1, wherein the first insulating film and second insulating film are comprised of different materials each selected from a group consisting of $SiO_2$, $Si_3N_4$, $Ta_2O_5$, $Nb_2O_5$, $GrO_2$ and $TiO_2$.

3. A semiconductor random access memory according to claim 1, wherein the first insulated film is comprised of $SiO_2$ and the second insulating film is comprised of $Si_3N_4$, and wherein the surface of the $Si_3N_4$ film is oxidized at its surface to form an oxide film having a thickness of 2–5 nm.

4. A semiconductor random access memory according to claim 1, wherein the semiconductor substrate includes an epitaxial layer in which each of the semiconductor random access memory cells is provided.

5. A semiconductor random access memory according to claim 1, wherein the semiconductor random access memory is arranged in an open bit line structure in which a plurality of sense amplifiers are provided, with a pair of bit lines connected to each sense amplifier, the bit lines and associated memory cells of each pair being physically located on opposite sides of the corresponding sense amplifier.

6. A semiconductor random access memory according to claim 1, wherein the semiconductor random access memory is arranged in a folded bit line structure in which a plurality of sense amplifiers are provided, with a pair of bit lines connected to each sense amplifier, the bit lines and associated memory cells of each pair being physically located adjacent each other on the same side of the corresponding sense amplifier.

7. A semiconductor random access memory which is formed in a semiconductor substrate comprising:
    a plurality of memory cells each of which includes a capacitor for storing information and an insulated gate field effect transistor for reading out the information stored in said capacitor, wherein each of the insulated gate field effect transistors has a channel region formed in a vertical direction perpendicular to a first main surface of the semiconductor substrate, said channel region being provided at right and left sidewall portions of a groove;
    word lines for applying signals to a gate electrode of each of the insulated gate field effect transistors;
    bit lines for reading out the information stored in said capacitors,
    wherein the capacitors each include a capacitor electrode formed in said substrate, and a capacitor plate provided with a constant voltage,
    wherein one of the source or drain regions of each of the insulated gate field effect transistors is electrically connected to the capacitor electrode of the respective capacitor, each of the gate electrodes of the insulated gate field effect transistors is electrically connected to the respective word line, and the other of the drain or source regions of each of the insulated gate field effect transistors is electrically connected to the respective bit line,
    wherein the drain or source electrode of each of the insulated gate field effect transistors is electrically connected to each of the channel regions provided at right and left sidewall portions of a groove;
    a capacitor insulating film formed between the capacitor electrode and the capacitor plate, wherein each of said insulated gate field effect transistors is formed to include a first region in contact with the capacitor electrode to serve as a source or drain region for said insulated gate field effect transistors, and each of the first regions is electrically connected to the channel region provided at right and left sidewall portions of a groove;

a gate insulating film extending vertically over said first region to define a groove formed by an inner sidewall of the gate insulating film;

a gate electrode formed in said groove to be separated from the first region by the gate insulating film; and a second region formed above the first region and along an outer sidewall of said gate insulating film to be in contact with the first region and isolated from the gate electrode by the gate insulating film, wherein said second region serves as said channel region, and wherein at least a portion of each of said insulated gate field effect transistors is formed on at least a portion of the respective capacitor.

8. A semiconductor random access memory according to claim 7, wherein the first insulating film and second insulating film are comprised of different materials each selected from a group consisting of $SiO_2$, $Si_3N_4$, $Ta_2O_5$, $Nb_2O_5$, $GrO_2$ and $TiO_2$.

9. A semiconductor random access memory according to claim 7, wherein the first insulated film is comprised of $SiO_3$ and the second insulating film is comprised of $Si_3N_4$, and wherein the surface of the $Si_3N_4$ film is oxidized at its surface to form an oxide film having a thickness of 2–5 nm.

10. A semiconductor random access memory according to claim 7, wherein the semiconductor substrate includes an epitaxial layer in which each of the semiconductor random access memory cells is provided.

11. A semiconductor random access memory according to claim 7, wherein the semiconductor random access memory is arranged in an open bit line structure in which a plurality of sense amplifiers are provided, with a pair of bit lines connected to each sense amplifier, the bit lines and associated memory cells of each pair being physically located on opposite sides of the corresponding sense amplifier.

12. A semiconductor random access memory according to claim 7, wherein the semiconductor random access memory is arranged in a folded bit line structure in which a plurality of sense amplifiers are provided, with a pair of bit lines connected to each sense amplifier, the bit lines and associated memory cells of each pair being physically located adjacent each other on the same side of the corresponding sense amplifier.

13. A semiconductor random access memory which is formed in a semiconductor substrate comprising:

a plurality of memory cells each of which includes a capacitor for storing information and an insulated gate field effect transistor for reading out the information stored in said capacitor, wherein each of the insulated gate field effect transistors has a channel region formed in a vertical direction perpendicular to a first main surface of the semiconductor substrate;

word lines for applying signals to a gate electrode of each of the insulated gate field effect transistors;

bit lines for reading out the information stored in said capacitors, wherein the capacitors each include a capacitor electrode formed in said substrate, and a capacitor plate provided with a constant voltage, wherein one of the source or drain regions of each of the insulated gate field effect transistors is electrically connected to the capacitor electrode of the respective capacitor, each of the gate electrodes of the insulated gate field effect transistors is electrically connected to the respective word line, and the other of the drain or source regions of each of the insulated gate field effect transistors is electrically connected to the respective bit line;

a capacitor insulating film formed between the capacitor electrode and the capacitor plate, said capacitor insulating film having a first insulating film and a second insulating film, wherein each of said insulated gate field effect transistors is formed to include a first region in contact with the capacitor electrode to serve as a source or drain region for said insulated gate field effect transistors;

a gate insulating film extending vertically over said first region to define a groove formed by an inner sidewall of the gate insulating film;

a gate electrode formed in said groove to be separated from the first region by the gate insulating film; and a second region formed above the first region and along an outer sidewall of said gate insulating film to be in contact with the first region and isolated from the gate electrode by the gate insulating film, wherein said second region serves as said channel region, and wherein at least a portion of each of said insulated gate field effect transistors is formed on at least a portion of the respective capacitor.

14. A semiconductor random access memory according to claim 13, wherein the first insulating film and second insulating film are comprised of different materials each selected from a group consisting of $SiO_2$, $Si_3N_4$, $Ta_2O_5$, $Nb_2O_5$, $GrO_2$ and $TiO_2$.

15. A semiconductor random access memory according to claim 13, wherein the first insulated film is comprised of $SiO_2$ and the second insulating film is comprised of $Si_3N_4$, and wherein the surface of the $Si_3N_4$ film is oxidized at its surface to form an oxide film having a thickness of 2–5 nm.

16. A semiconductor random access memory according to claim 13, wherein the semiconductor substrate includes an epitaxial layer in which each of the semiconductor random access memory cells is provided.

17. A semiconductor random access memory according to claim 13, wherein the semiconductor random access memory is arranged in an open bit line structure in which a plurality of sense amplifiers are provided, with a pair of bit lines connected to each sense amplifier, the bit lines and associated memory cells of each pair being physically located on opposite sides of the corresponding sense amplifier.

18. A semiconductor random access memory according to claim 13, wherein the semiconductor random access memory is arranged in a folded bit line structure in which a plurality of sense amplifiers are provided, with a pair of bit lines connected to each sense amplifier, the bit lines and associated memory cells of each pair being physically located adjacent each other on the same side of the corresponding sense amplifier.

* * * * *